(12) United States Patent
Jalili Sebardan et al.

(10) Patent No.: US 11,431,307 B2
(45) Date of Patent: Aug. 30, 2022

(54) CURRENT SIGNAL GENERATION USEFUL FOR SAMPLING

(71) Applicant: SOCIONEXT INC., Kanagawa (JP)

(72) Inventors: Armin Jalili Sebardan, Maidenhead (GB); Alistair John Gratrex, Maidenhead (GB)

(73) Assignee: SOCIONEXT INC., Kanagawa (JP)

( * ) Notice: Subject to any disclaimer, the term of this patent is extended or adjusted under 35 U.S.C. 154(b) by 268 days.

(21) Appl. No.: 16/902,808

(22) Filed: Jun. 16, 2020

(65) Prior Publication Data

US 2020/0395904 A1 Dec. 17, 2020

(30) Foreign Application Priority Data

Jun. 17, 2019 (EP) ..................................... 19180663

(51) Int. Cl.
*H03F 3/45* (2006.01)
*H03M 1/12* (2006.01)
(Continued)

(52) U.S. Cl.
CPC ........... *H03F 3/45* (2013.01); *G01R 19/0092* (2013.01); *H03F 3/2175* (2013.01); *H03M 1/1205* (2013.01)

(58) Field of Classification Search
CPC ..... H03F 3/45; H03F 3/2175; G01R 19/0092; H03M 1/1205; H03M 1/1215
(Continued)

(56) References Cited

U.S. PATENT DOCUMENTS 5,869,999 A 2/1999 Mawet
6,127,856 A 10/2000 Ueda
(Continued)

OTHER PUBLICATIONS

Tang Yuxuan et al: "A Low-Power SiPM Readout Front-End with Fast Pulse Generation and Successive-Approximation Register ADC in 0.18 μm CMOS", 2019 IEEE International Symposium on Circuits and Systems (ISCAS), IEEE, May 26, 2019 (May 26, 2019), pp. 1-4, XP033573966, ISSN: 2158-1525, DOI: 10.1109/ISCAS.2019.8702235 ISBN: 978-1-7281-0397-6 [retrieved on Apr. 29, 2019].
(Continued)

*Primary Examiner* — Hieu P Nguyen
(74) *Attorney, Agent, or Firm* — McDermott Will & Emery LLP

(57) ABSTRACT

Sampler circuitry, having: an input node which receives an input voltage signal; a primary current path connected between high and low voltage supply nodes; a secondary current path connected between high and low voltage supply nodes; current mirror circuitry; and load circuitry having sampler switches which sample a current signal, where the input node is defined along the primary current path, the primary current path configured to carry a primary current dependent on the input voltage signal; the current mirror circuitry includes a primary side and a secondary side, the primary side connected along the primary current path and the secondary side connected along the secondary current path so that a secondary current dependent on the primary current is caused to flow along the secondary current path; and the load circuitry is connected along the secondary current path so that the secondary current at least partly forms the current signal.

15 Claims, 12 Drawing Sheets

(51) Int. Cl.
*G01R 19/00* (2006.01)
*H03F 3/217* (2006.01)

(58) Field of Classification Search
USPC .................................. 330/252–261; 341/144
See application file for complete search history.

(56) References Cited

U.S. PATENT DOCUMENTS

| | | | |
|---|---|---|---|
| 7,030,697 B1 | 4/2006 | Pribytko et al. | |
| 7,532,045 B1 | 5/2009 | Mulders | |
| 8,976,050 B1* | 3/2015 | Dedic | H03M 1/0624 341/110 |
| 9,467,310 B2 | 10/2016 | Bankman et al. | |
| 2013/0249633 A1 | 9/2013 | Mehrabi et al. | |
| 2015/0222286 A1 | 8/2015 | Zhang et al. | |

OTHER PUBLICATIONS

Extended European Search Report issued in European Patent Application No. 19180663.7 dated Dec. 19, 2019.

* cited by examiner

CURRENT SIGNAL GENERATION USEFUL FOR SAMPLING

CROSS-REFERENCE OF RELATED APPLICATIONS

This application claims the benefit of European Patent Application 19180663.7, filed on Jun. 17, 2019, the entire disclosure of which Application is incorporated by reference herein.

The present invention relates to current signal generation useful for sampling, and in particular to circuitry for receiving an input voltage signal and generating a current signal based on the input voltage signal.

Such circuitry comprises load circuitry, which may be current-mode circuitry, operable based on the current signal. In one example, the current-mode circuitry may be part or all of a sampler operable to sample the current signal (representative of the input voltage signal). For ease of understanding, such an example will be followed herein with applicability in or as analogue-to-digital circuitry. Corresponding methods are also envisaged.

By way of context, reference may be made to EP2211468, FIGS. 9, 10 and 16 of which are reproduced as FIGS. 1, 2 and 3 herein. A brief description of these Figures is provided below to aid the reader in understanding a potential application of the present invention. A fuller description can be found in EP2211468.

FIG. 1 is a schematic diagram of analogue-to-digital circuitry 41. Circuitry 41 comprises sampler 42, voltage-controlled oscillator (VCO) 44, demultiplexers 46, ADC banks 48, digital unit 50 and calibration unit 52.

The sampler 42 is configured to perform four-way or four-phase time-interleaving so as to split the input current $I_{IN}$ into four time-interleaved sample streams A to D. The sampler 42 operates in the current mode, and, accordingly, streams A to D are effectively four time-interleaved streams of current pulses originating from (and together making up) input current $I_{IN}$, each stream having a sample rate one quarter of the overall sample rate. Four sets of n digital streams (following multiplexing 46 and analogue-to-digital conversion 48) are input to the digital unit 50 which multiplexes those streams to produce a single digital output signal representative of the analogue input signal, current $I_{IN}$. Calibration unit 52 calibrates operation of the sampler 42, demultiplexers 46 and/or ADC banks (sub-ADC units) 48, based on the digital output signal.

FIG. 2 is a schematic circuit diagram of four-phase (i.e. multiphase) current-mode (current-steering) sampler 42. Sampler 42 is configured to receive such a differential input current signal, modeled here as a current source $I_{IN}$ whose magnitude varies with the input signal. Because of the differential signaling, sampler 42 effectively has two matching (or corresponding or complementary) sections 54 and 56 for the two differential inputs. Accordingly, there is a first set of output streams $IOUT_A$ to $IOUT_D$ in section 54 and a second set of matching output streams $IOUTB_A$ to $IOUTB_D$, where IOUTB means $\overline{IOUT}$, and wherein $IOUT_A$ is paired with $IOUTB_A$, $IOUT_B$ is paired with $IOUTB_B$, and so on and so forth.

Focusing on the first section 54 by way of example (because the second section 56 operates analogously to the first section 54), there are provided four n-channel MOSFETs $58_A$ to $58_D$ (i.e. one per stream or path) with their source terminals connected together at a common tail node 60. The gate terminals of the four transistors $58_A$ to $58_D$ are driven by the four clock signals $\theta_0$ to $\theta_3$, respectively, provided from the VCO 44.

The current drawn from the common tail node 60 is defined by the DC current source 62 for that node and the current source $I_{IN}$. Similarly, the current drawn from the common tail node 66 (of the second section 56) is defined by the DC current source 68 for that node and the current source $I_{IN}$. Transistors $64_A$ to $64_D$ of section 56 correspond respectively to transistors $58_A$ to $58_D$ of section 54, and are similarly driven by the four clock signals $\theta_0$ to $\theta_3$, respectively, provided from the VCO 44.

As already mentioned, ADC circuitry 41 operates in the current domain, i.e. effectively as a current-mode ADC. As a result, the input signal required is a current signal. However, typical signals that require use of an ADC or sampler are voltage-domain signals, in which the variable under examination is a voltage rather than a current. FIG. 3 is a schematic circuit diagram of an example implementation 43 of sampling circuitry (sampler) 42, to which it is possible to apply an input differential voltage signal.

Implementation 43, similarly to circuitry 42, comprises two sections 54 and 56 for the so-called "plus" and "minus" components of the differential signals. Section 54 comprises switching transistors $58_A$ to $58_D$ connected to common tail node 60, and section 56 comprises switching transistors $64_A$ to $64_D$ connected to common tail node 66, as before.

Implementation 43 basically works by receiving the input voltage signal and by employing resistances to passively convert the received input voltage signal into an equivalent input current signal. An example set of resistance values are shown in FIG. 3. These values have been chosen assuming an example design objective that the input impedance looking into each of the common tail nodes 60 and 66 towards the switching transistors (sampler switches) is 50Ω, and that the input impedance looking into each of the input terminals 104 and 106 is also 50Ω as shown in FIG. 3.

There is ever increasing pressure on the performance of such circuitry, in particular sampler circuitry (for example for an ADC), for example in relation to its bandwidth.

It is desirable to provide improved circuitry in light of the above.

According to an embodiment of a first aspect of the present invention, there is provided sampler circuitry, comprising: an input node configured to receive an input voltage signal; a primary current path connected between high and low voltage supply nodes; a secondary current path connected between high and low voltage supply nodes; current mirror circuitry; and load circuitry comprising sampler switches operable to sample a current signal, wherein: the input node is defined along the primary current path, the primary current path configured to carry a primary current dependent on the input voltage signal; the current mirror circuitry comprises a primary side and a secondary side, the primary side connected along the primary current path and the secondary side connected along the secondary current path so that a secondary current dependent on the primary current is caused to flow along the secondary current path; and the load circuitry is connected along the secondary current path so that the secondary current at least partly forms the current signal.

Such circuitry enables the secondary current to be provided with gain compared to the primary current. The sampler circuitry can be considered to be "folded" due to the current mirror circuitry. The "folding" of the sampler circuitry enables reduced stacking and achieves associated advantages as described herein. The "folding" of the sampler circuitry can lead to improved S11 (the S11 scattering parameter) performance, and can reduce a trade-off between S11 performance and gain which can affect other circuitry aimed at providing a current signal.

The load circuitry is connected along the secondary current path rather than along the primary current path so that the secondary current rather than the primary current at least partly forms the current signal.

The high voltage supply node for the primary current path and the high voltage supply node for the secondary current path may be the same as or different from each other. The low voltage supply node for the primary current path and the low voltage supply node for the secondary current path may be the same as or different from each other.

The sampler circuitry may comprise a current source connected along the primary current path and configured to define a bias current flowing along that path.

The primary current may be considered to comprise: a DC bias current component defined by the current source; and an AC current component dependent on the input voltage signal.

The input node may be located along the primary current path so as to divide the primary current path into first and second portions, the first portion of the primary current path configured to carry the primary current; and the primary side of the current mirror circuitry may be connected along the first portion of the primary current path. In other words, the location of the input node may define the first and second portions of the primary current path. Put another way, the input node may be located to define the first and second portions of the primary current path. In other words, the primary current path may comprise the first portion of the primary current path connected between the high voltage supply node and the input node, and the second portion of the primary current path connected between the input node and the low voltage supply node.

The sampler circuitry may comprise an impedance connected in series along the first portion of the primary current path between the input node and the primary side of the current mirror circuitry.

The impedance may be referred to as a second impedance, and the sampler circuitry may comprise a first impedance connected in series along the second portion of the primary current path.

The first impedance may be implemented as a resistor or as a resistor connected in series with an inductor; and/or the second impedance may be implemented as a resistor or as a resistor connected in parallel with a capacitor.

The sampler circuitry may comprise: a third impedance connected in series along the primary current path between the high voltage supply node concerned and the primary side of the current mirror circuitry; and/or a fourth impedance connected in series along the secondary current path between the high voltage supply node concerned and the secondary side of the current mirror circuitry.

The third impedance may be implemented as a resistor or as a resistor connected in series with an inductor; and/or the fourth impedance may be implemented as a resistor or as a resistor connected in parallel with a capacitor.

The sampler circuitry may comprise a fifth impedance connected between the primary and secondary sides of the current mirror circuitry. The fifth impedance may be connected between gate terminals of a diode-connected transistor of the primary side and a corresponding mirror transistor of the secondary side of the current mirror circuitry. The fifth impedance may be implemented as an inductor.

The sampler circuitry may comprise control circuitry operable to configure the current mirror circuitry so as to control a gain provided by the current mirror circuitry in the secondary current relative to the primary current.

The control circuitry may be configured to control one or more voltage signals applied to the gates of one or more transistors of the current mirror circuitry. The control circuitry may be configured to control the one or more voltage signals applied to the gates of the one or more transistors of the current mirror circuitry to switch the or those transistors on or off, to control the gain provided by the current mirror circuitry. Thereby the gain may be adjusted. In other words, the sampler circuitry can achieve programmability (programmable gain). The gain may be adjusted to compensate for loss due to parasitic capacitance and any other effects which might degrade the signal level of the current signal. That is, calibration may be performed by adjusting/programming the gain to tune out parasitic capacitances and other effects that reduce the magnitude of or otherwise degrade the current signal.

The primary and secondary sides of the current mirror circuitry may each comprise at least one cascode transistor, and the voltage signals controlled by the control circuitry may be voltage signals provided to the gates of cascode transistors of the current mirror circuitry. These voltage signals may be provided to the gates of one or more cascode transistors of the secondary side of the current mirror circuitry.

The control circuitry may be configured to control one or more gate voltages of one or more cascode transistors, respectively, of the primary side of the current mirror circuitry so that the one or more cascode transistors of the primary side of the current mirror circuitry operate at or around the border of their triode and saturation regions.

The sampler switches may comprise switching transistors. The load circuitry may be a front-end of an analogue-to-digital converter. The load circuitry may comprise current-mode circuitry.

According to an embodiment of a second aspect of the present invention, there is provided differential sampler circuitry comprising a first section and a second section, the first and second sections each comprising sampler circuitry of the aforementioned first aspect of the present invention.

The differential sampler circuitry may comprise differential load circuitry comprising the load circuitry of the first section and the load circuitry of the second section, the first and second sections may share the same current source, and the differential sampler circuitry may be configured to: receive a differential input voltage signal as said input voltage signals received by the first and second sections; and output to the differential load circuitry a differential output current signal as said current signals.

According to an embodiment of a third aspect of the present invention, there is provided analogue-to-digital conversion circuitry operable to generate a digital output signal based upon an analogue input differential current signal, wherein: the analogue-to-digital conversion circuitry comprises the differential sampler circuitry of the aforementioned second aspect of the present invention; and the analogue input differential current signal of the analogue-to-digital conversion circuitry comprises the differential output current signal of the differential sampler circuitry.

According to an embodiment of a fourth aspect of the present invention, there is provided analogue-to-digital conversion circuitry comprising the sampler circuitry of the aforementioned first aspect of the present invention, or the differential sampler circuitry of the aforementioned second aspect of the present invention.

According to an embodiment of a fifth aspect of the present invention, there is provided integrated circuitry, such as an IC chip, comprising the sampler circuitry of the aforementioned first aspect of the present invention, or the differential sampler circuitry of the aforementioned second aspect of the present invention, or the analogue-to-digital conversion circuitry of the aforementioned third aspect of the present invention, or the analogue-to-digital conversion circuitry of the aforementioned fourth aspect of the present invention.

According to an embodiment of a sixth aspect of the present invention, there is provided a circuitry system, comprising: an input node configured to receive an input voltage signal; a primary current path connected between high and low voltage supply nodes; a secondary current path connected between high and low voltage supply nodes; current mirror circuitry; and load circuitry operable based on a current signal, wherein: the input node is defined along the primary current path, the primary current path configured to carry a primary current dependent on the input voltage signal; the current mirror circuitry comprises a primary side and a secondary side, the primary side connected along the primary current path and the secondary side connected along the secondary current path so that a secondary current dependent on the primary current is caused to flow along the secondary current path; and the load circuitry is connected along the secondary current path so that the secondary current at least partly forms the current signal.

According to an embodiment of a seventh aspect of the present invention, there is provided sampler circuitry, comprising: a voltage input node; a current source for supplying a sampling current to the voltage input node; a plurality of switch transistors for sampling input current signals; and a current mirror circuit that couples the plurality of switch transistors with the voltage input node and the current source.

According to an embodiment of an eighth aspect of the present invention, there is provided sampler circuitry operable based on a differential input voltage signal provided between first and second input nodes, the sampler circuitry comprising: load circuitry comprising sampler switches configured to sample first and second load currents which define a differential current signal, the load circuitry having first and second load nodes and a biasing node; a power supply node for connection to a voltage source; a first current path extending from the power supply node to the first load node to provide the first load current at the first load node for use by the load circuitry, wherein a first supply-connection impedance is connected along the first current path between the power supply node and the first load node; a second current path extending, in parallel with the first current path, from the power supply node to the second load node to provide the second load current at the second load node for use by the load circuitry; wherein a second supply-connection impedance is connected along the second current path between the power supply node and the second load node; first and second input-connection impedances; and control circuitry, wherein: the control circuitry is configured, based on measurement of a common mode voltage indicative of a common mode between voltages at the first and second load nodes, to control a biasing signal provided to the biasing node of the load circuitry to regulate the common mode voltage; and the first and second input nodes are connected to the first and second load nodes via the first and second input-connection impedances, respectively, so that the differential current signal is dependent on the differential input voltage signal.

Such circuitry can achieve "peaking" in the gain profile— i.e. gain boosting at high frequency. In other words such circuitry can achieve gain, where gain here refers to the ratio of the magnitude of the differential current signal at high (higher) frequencies (of the differential input voltage signal) to the magnitude of the differential current signal at low (lower) frequencies (of the differential input voltage signal). The sampler circuitry of the eighth aspect of the present invention (between the input and load nodes, i.e. excluding the load circuitry) can be considered to be passive. The sampler circuitry of the eighth aspect of the present invention can achieve reduced stacking and can achieve decoupling of the S11 performance from the gain.

In the aforementioned eighth aspect of the present invention, the control circuitry may comprise first and second measurement impedances connected in series between the first and second load nodes, and may be configured to measure the common mode voltage from a measurement node between the first and second measurement impedances.

The first and second measurement impedances may be implemented as resistors; and/or the first and second measurement impedances may have the same impedance as one another.

The sampler circuitry of the aforementioned eighth aspect of the present invention may comprise an auxiliary current path connected between the first and second input nodes, and having an auxiliary impedance connected therealong.

The first and second supply-connection impedances may be implemented as resistors or as resistors connected in series with respective inductors; and/or the first and second supply-connection impedances may have the same impedance as one another; and/or the first and second input-connection impedances may be implemented as resistors or as resistors connected in parallel with respective capacitors; and/or the first and second input-connection impedances may have the same impedance as one another; and/or the auxiliary impedance may be implemented as a resistor or as a resistor connected in series with an inductor.

The first and second load currents may be considered to comprise: respective DC bias current components defined by a voltage level of the voltage source, the first and second supply-connection impedances, respectively, and the common-mode voltage; and respective AC current components dependent on the differential input voltage signal.

The regulation of the common mode voltage may cause the DC bias currents to be regulated.

In the aforementioned eighth aspect of the present invention, the sampler switches may comprise switching transistors connected to the first and second load nodes, and the biasing signal may control the DC voltage level of gate-control switching signals provided to the gate terminals of the switching transistors.

In the aforementioned eighth aspect of the present invention, the load circuitry may be a front-end of an analogue-to-digital converter. In the aforementioned eighth aspect of the present invention, the load circuitry may comprise current-mode circuitry. In the aforementioned eighth aspect of the present invention, the load circuitry may be differential load circuitry.

According to an embodiment of a ninth aspect of the present invention, there is provided analogue-to-digital conversion circuitry operable to generate a digital output signal based upon an analogue input differential current signal, wherein: the analogue-to-digital conversion circuitry comprises the sampler circuitry of the aforementioned eighth aspect of the present invention; and the sampler circuitry is configured to generate the analogue input differential current signal as said differential current signal dependent on the differential input voltage signal.

According to an embodiment of a tenth aspect of the present invention, there is provided integrated circuitry, such as an IC chip, comprising the sampler circuitry of the aforementioned eighth aspect of the present invention, or the analogue-to-digital conversion circuitry of the aforementioned ninth aspect of the present invention.

According to an embodiment of an eleventh aspect of the present invention, there is provided differential circuitry operable based on a differential input voltage signal provided between first and second input nodes, the differential circuitry comprising: load circuitry configured to operate based on first and second load currents which define a differential current signal, the load circuitry having first and second load nodes and a biasing node; a power supply node for connection to a voltage source; a first current path extending from the power supply node to the first load node to provide the first load current at the first load node for use by the load circuitry, wherein a first supply-connection impedance is connected along the first current path between the power supply node and the first load node; a second current path extending, in parallel with the first current path, from the power supply node to the second load node to provide the second load current at the second load node for use by the load circuitry, wherein a second supply-connection impedance is connected along the second current path between the power supply node and the second load node; first and second input-connection impedances; and control circuitry, wherein: the control circuitry is configured, based on measurement of a common mode voltage indicative of a common mode between voltages at the first and second load nodes, to control a biasing signal provided to the biasing node of the load circuitry to regulate the common mode voltage; and the first and second input nodes are connected to the first and second load nodes via the first and second input-connection impedances, respectively, so that the differential current signal is dependent on the differential input voltage signal.

According to an embodiment of a twelfth aspect of the present invention, there is provided sampler circuitry, comprising: a pair of differential voltage input nodes; a pair of switch transistor groups for sampling input current signals; a pair of first resistors (input resistors) provided between the pair of switch transistor groups and the pair of differential input nodes; a second resistor (for detecting a common mode voltage) provided between the pair of switch transistor groups; a pair of third resistors (for flowing a sampling current) provided between the pair of switch transistor groups and a voltage source node (AVD); and a feedback loop control circuit that controls a DC voltage supplied to gates of switch transistors constituting each of the switch transistor groups so that a constant current flows through the third resistors on the basis of a voltage of an intermediate node of the second resistor.

Features of method aspects may apply equally to apparatus aspects, and vice versa.

Reference will now be made, by way of example, to the accompanying drawings, of which:

FIG. 1, as mentioned above, is a schematic diagram of analogue-to-digital circuitry useful for understanding a potential application of the present invention;

FIG. 2, as mentioned above, is a schematic diagram of the current-steering sampler of FIG. 1;

FIG. 3, as mentioned above, is a schematic diagram of the current-steering sampler of FIG. 1 to which it is possible to apply an input differential voltage signal;

Figure 3:
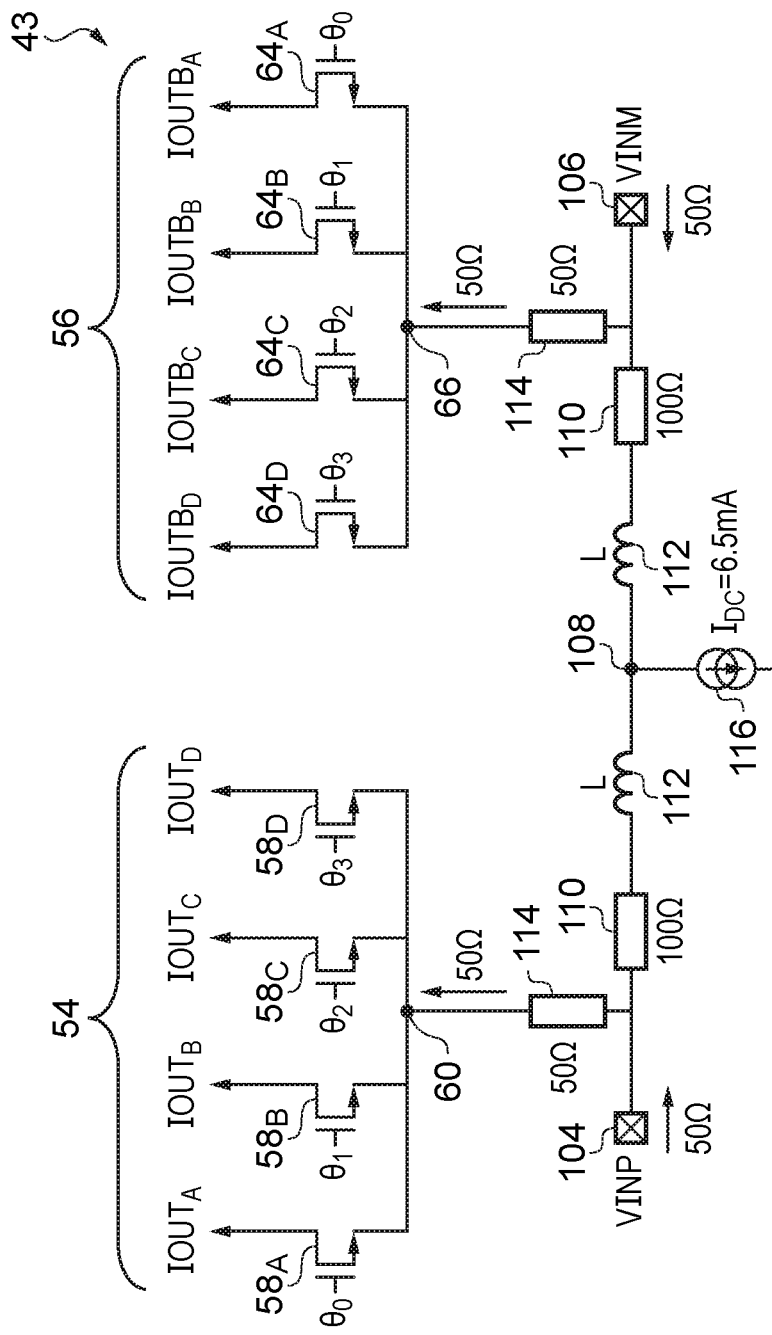
Figure 4:
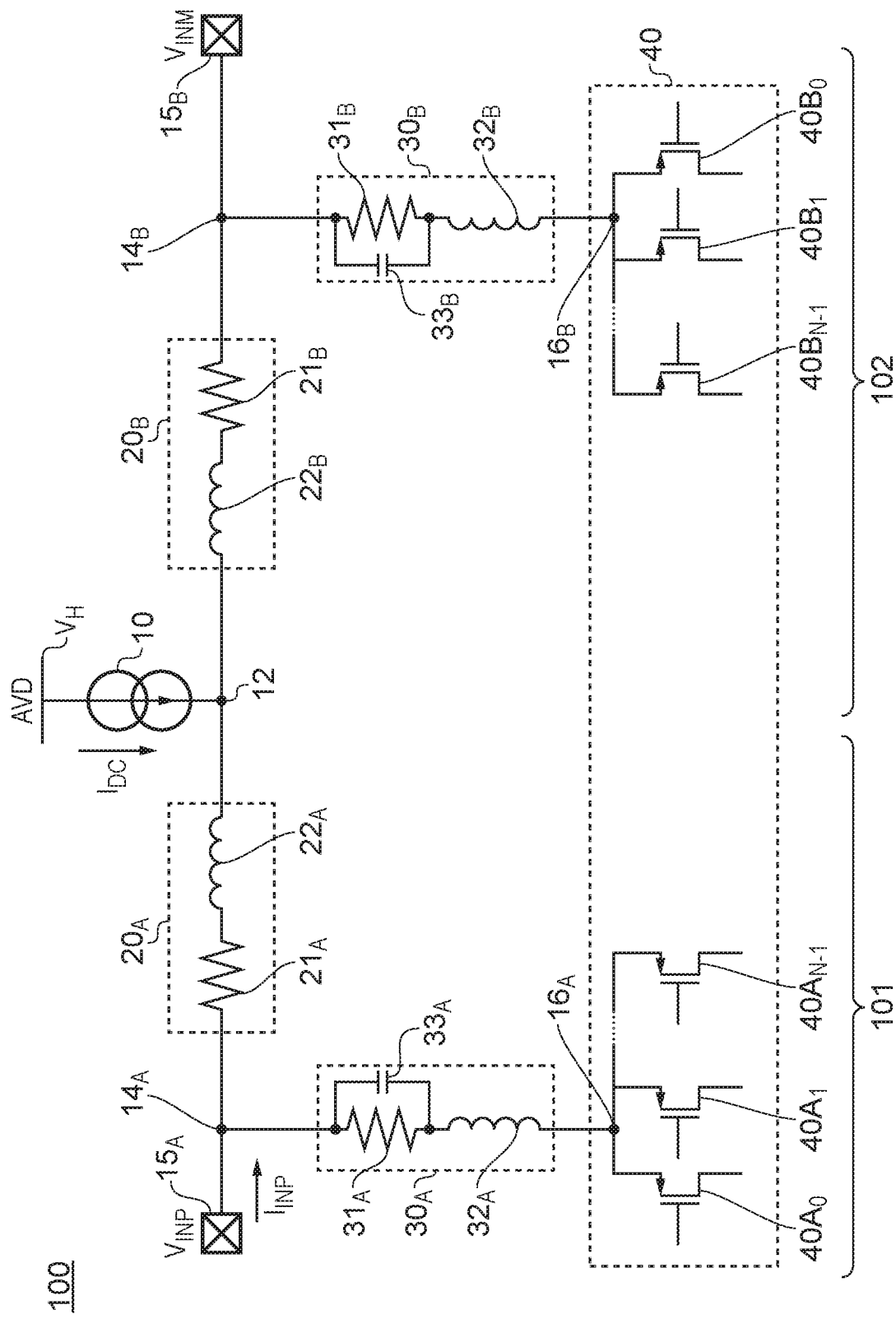
FIG. 4 is a schematic diagram of sampler circuitry, as a comparative example.

FIG. 4 is a schematic diagram of sampler circuitry 100, as a comparative example. Similarities with the implementation 43 of sampling circuitry 42 shown in FIG. 3 will be apparent. Sampler circuitry 100 is shown in FIG. 4 as differential circuitry operable based on a differential input voltage signal. It will be apparent that sampler circuitry 100 may also be provided as single-ended circuitry operable based on a single-ended input voltage signal.

Sampler circuitry 100 comprises two matching (or corresponding or complementary) sections 101 and 102 for the two differential inputs (i.e. the two input voltage signals which form the differential input voltage signal). The first section 101 comprises an input node $14_A$, a first impedance $20_A$, a second impedance 30 and a load node $16_A$. The input node $14_A$ is configured to receive an input voltage signal $V_{INP}$ via a terminal 15A. The input node 14A and the terminal 15A as shown in FIG. 4 are denoted separately but they could be the same. The input node $14_A$ is connected to a tail node 12 via the first impedance $20_A$. The tail node 12 is connected via a current source 10 to a voltage reference (power supply node, or equally voltage source node) $V_H$ whose voltage level is above that of $V_{INP}$ (and $V_{INM}$). In particular, current source 10 supplies a constant (regulated) DC current $I_{DC}$ to the sampler circuitry 100. The current $I_{DC}$ may be referred to as a bias current and/or as a sampler current. The input node $14_A$ is connected to the load node $16_A$ via the second impedance $30_A$. The second section 102 has a corresponding arrangement (with like elements denoted with a subscript B rather than a subscript A) as shown in FIG. 4, including an input node $14_B$ to receive an input voltage signal $V_{INM}$. A detailed description of the second section 102 is therefore omitted. Input voltage signals $V_{INP}$ and $V_{INM}$ are the "plus" and "minus" components of the (differential) input voltage signal.

Figure 1:
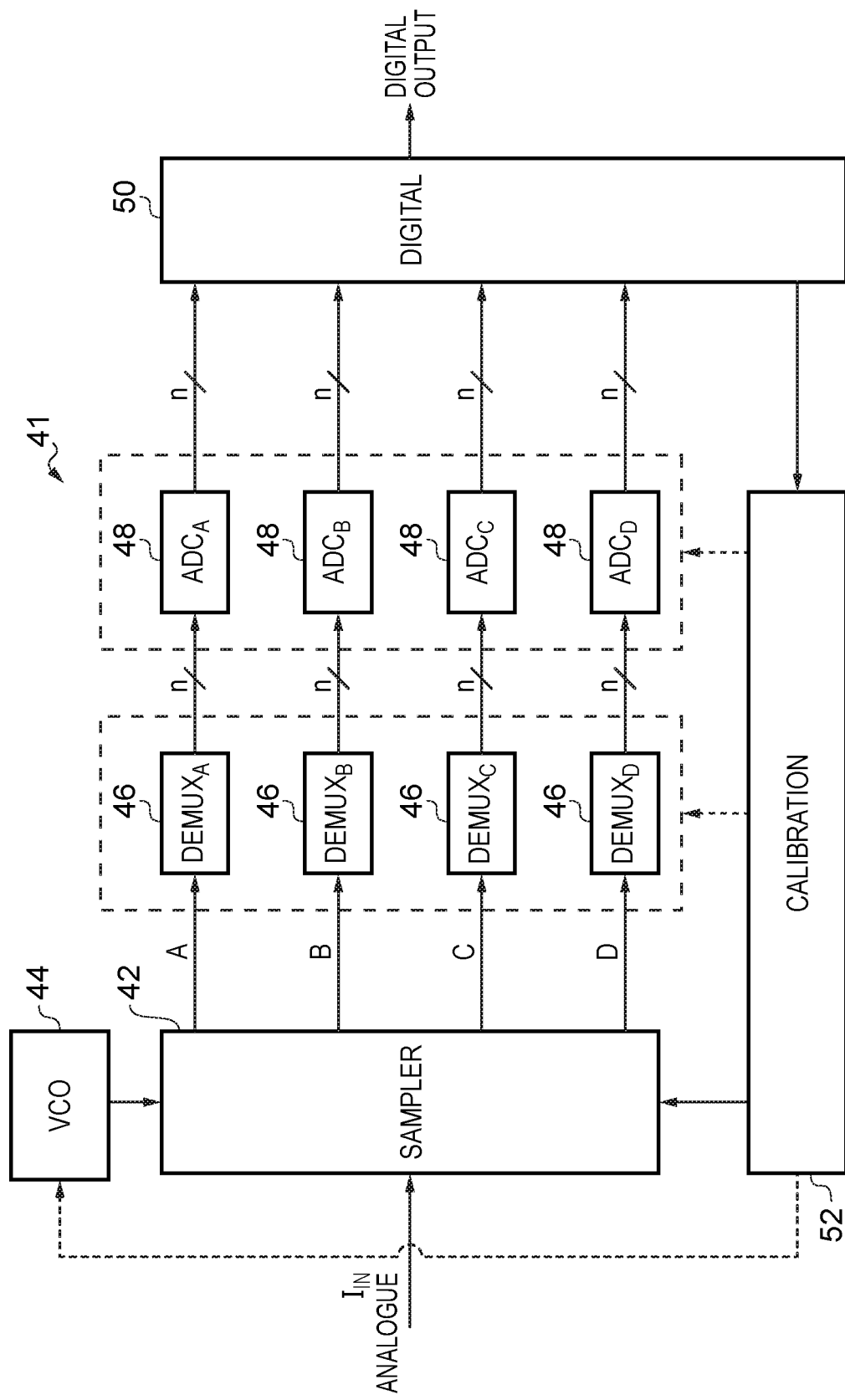
Figure 2:
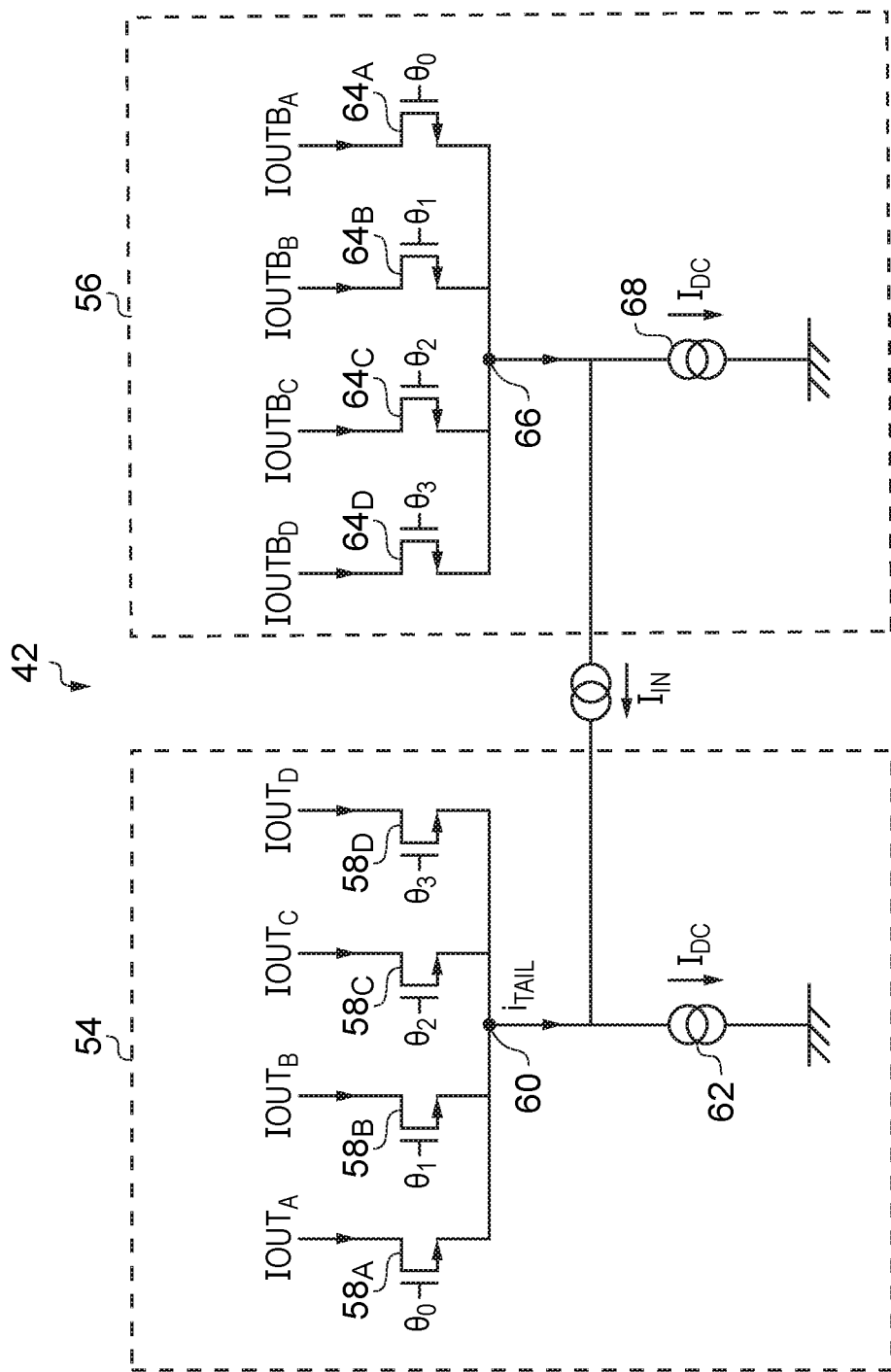

Sampler circuitry 100 comprises load circuitry 40. As shown in FIG. 4, load circuitry 40 comprises switches $40A_0$ to $40A_{N-1}$ connected to the load node $16_A$ of the first section 101, and switches $40B_0$ to $40B_{N-1}$ connected to the load node $16_B$ of the second section 102. The switches $40A_0$ to $40A_{N-1}$ and $40B_0$ to $40B_{N-1}$ may be referred to as sampling switches or sampler switches. In line with FIGS. 1 to 3, these sampling switches may be the sampling switches of a current-mode sampler (in such a case the sampling switches $40A_0$ to $40A_{N-1}$ and $40B_0$ to $40B_{N-1}$ may be controlled by time-interleaved clock signals). In general, however, it will be appreciated that the load circuitry 40 may comprise any current-mode circuitry. The load circuitry 40 (or subsequent circuitry connected beyond the load circuitry 40) will of course be connected to a voltage reference (power supply node) $V_L$ whose voltage level is below that of the voltage reference $V_H$. The voltage reference $V_H$ may be referred to as a high reference voltage and the voltage reference $V_L$ may be referred as a low voltage reference, and the potential difference between $V_H$ and $V_L$ may be referred to as the supply voltage (provided by a power supply).

In overview, sampler circuitry 100 operates by receiving the input voltage signal and by employing impedances to passively convert the received input voltage signal into an equivalent input current signal. For example, a differential input current signal is received by the load circuitry between (or at) the load nodes $16_A$ and $16_B$. In this regard, sampler circuitry 100 comprises voltage-to-current conversion circuitry, its output being the current signal received by the load circuitry 40 between the load nodes $16_A$ and $16_B$. Further, the sampler circuitry 100 may be referred to simply as circuitry or a circuitry system.

The first impedance $20_A$ as shown in FIG. 4 comprises a resistor $21_A$ and an inductor $22_A$ connected together in series. The second impedance $30_A$ as shown in FIG. 4 comprises a resistor $31_A$ and a capacitor $33_A$ connected together in parallel and an inductor $32_A$ connected with the resistor $31_A$ in series. In other arrangements the first impedance $20_A$ and the second impedance $30_A$ may comprise any component(s) that give rise to an impedance. The same considerations apply to the first and second impedances $20_B$ and $30_B$ of the second section 102.

As described above, sampler circuitry 100 can also be provided as single-ended circuitry operable based on a single-ended input voltage signal and operable to output a single-ended current signal. That is, single-ended sampler circuitry may comprise the first section 101, the current source 10, the tail node 12 and load circuitry (e.g. the relevant part of the load circuitry 40). The following description of the operation of the sampler circuitry 100 will be understood to apply equally to a single-ended implementation.

A brief summary of operation of sampler circuitry 100 is as follows, focusing on the first section 101 by way of example (with the understanding that sampler circuitry 100 may be single-ended and that in the case of differential sampler circuitry 100 a corresponding explanation applies for the second section 102). Ignoring for the moment the capacitor $33_A$ (as if it were not present) and the inductors $22_A$ and $32_A$ (as if they were shorted), i.e. considering operation at DC, the amount of current flowing through resistor $31_A$ is effectively a portion of the current $I_{DC}$ dependent in part on the value of the input voltage signal $V_{INP}$ (and of course the resistance impedance values). This current flows through the load circuitry 40 (the switches $40A_0$ to $40A_{N-1}$ in FIG. 4) and may be referred to as a load current (or a first load current for a differential implementation of sampler circuitry 100). A current $I_{INP}$ is drawn in at the input node $14_A$ and is split between resistors $21_A$ and $31_A$. The proportion of the current $I_{INP}$ which flows through each of the resistors $21_A$ and $31_A$ can be adjusted by appropriate selection of the resistance values of the resistors $21_A$ and $31_A$. It is possible to select these resistors for each application so that the desired proportion of the current $I_{INP}$ flows through each of the resistors $21_A$ and $31_A$. However, it is difficult to make the resistance values of the resistors $21_A$ and $31_A$ switchable without affecting bandwidth and input parasitic capacitance of the sampler circuitry 100. For the purpose of the following description it is assumed that sampler circuitry 100 corresponds generally to the sampler 42 of FIG. 1 and connects to the input of sub-ADC units (corresponding to the sub-ADC units 48 of FIG. 1), perhaps via demultiplexing stages (corresponding to demultiplexing stages 46 of FIG. 1), but as mentioned above the load circuitry 40 could be any current-mode circuitry.

At high frequency (of the input voltage signal $V_{INP}$) there are two peaking mechanisms which boost the amount of current passing though the sampler switches $40A_0$ to $40A_{N-1}$. The first peaking mechanism is the capacitor $33_A$, which may be referred to as a shunting capacitor. At high frequencies (in relative terms), the effective AC resistance of the resistor $31_A$ connected in parallel to the capacitor $33_A$ drops, which in turn increases the amount of current injected to the sampler switches $40A_0$ to $40A_{N-1}$. The second peaking mechanism is the inductor $22_A$. At high frequencies (in relative terms), the inductor $22_A$ increases the impedance seen looking into the first impedance $20_A$ from the input (or branch) node $14_A$ and so causes the proportion of the current $I_{INP}$ which flows through the first impedance $20_A$ to decrease. On the other hand, the impedance seen looking into the input node $14_A$ from the input terminal $15_A$ increases, which in turn causes the current $I_{INP}$ to decrease. The amount of current drop in the proportion of the current $I_{INP}$ flowing through the first impedance $20_A$ is more than the overall current drop in the current $I_{INP}$. So, the overall effect of the inductor $22_A$ is that the proportion of the current $I_{INP}$ flowing through the second impedance $30_A$ (and so the current flowing through the sampler switches $40A_0$ to $40A_{N-1}$) increases in magnitude. Corresponding considerations apply to the second section 102 and the current flowing through the sampler switches $40B_0$ to $40B_{N-1}$.

Due to the shunting mechanism described above with regard to the shunting capacitor $33_A$, the impedance seen looking into the input node $14_A$ from the input terminal $15_A$ changes significantly, which leads to unwanted effects. To restore some of this impedance and bring it closer to its ideal value (for example 50 ohms), the inductor $32_A$ is added to the second impedance $30_A$ The inductor $32_A$ helps to bring the scattering parameter S11 (a common measure of the performance of a circuit) close to its required or desired value.

It has been found that there are some disadvantages with the structure of the sampler circuitry 100 shown in FIG. 4, which are described below with reference to the first section 101 of the sampler circuitry 100 (with the same considerations applying to the second section 102).

A first disadvantage is that there is a strong trade-off between the amount of gain (peaking) and the value of the S11 parameter. Gain is used here to refer to the amount of gain "peaking", i.e. the current flowing into the load node $16_A$, at high frequency (of the input voltage signal $V_{INP/M}$) compared to at low frequency (of the input voltage signal $V_{INP/M}$), in particular the ratio of the amount of current passing through the load node $16_A$ (and thus the sampler switches) at high input frequencies divided by the amount of current passing through the load node $16_A$ at low input frequencies. Of course, in general the gain of the sampler circuitry 100 can be considered to be the current flowing into the load node $16_A$ divided by the input voltage $V_{INP}$, or in the differential case to be the difference between the currents flowing into the load nodes $16_A$ and $16_B$ divided by the difference between $V_{INP}$ and $V_{INM}$. Gain in this latter sense could be expressed as $I=G(f) \cdot Vin$, where Vin is the input voltage, I is the output current and Gain G(f) is a function of frequency f of the input voltage signal. Increasing the value of the inductance of the inductor $22_A$ and/or the value of capacitance of the shunting capacitor $33_A$, although increasing gain peaking, takes the impedance seen looking into the input node $14_A$ from the input terminal $15_A$ further away from its ideal value which in turns degrades the value of the S11 parameter.

A second disadvantage is a relatively low voltage headroom. That is, there is a large number of devices/components stacked on top of one another, from the current source 10 down to the load circuitry 40 (and other subsequent circuitry). The supplied voltage is "used up" by the large number of devices stacked on top of one another. This puts pressure in terms of voltage headroom on the devices (in particular, of the load circuitry 40) and makes it difficult (and up to a point, impossible) to reduce the voltage supply (which would be advantageous from a power-saving point of view).

A third disadvantage is the difficulty associated with current scaling. That is, the amount of current that can be injected towards the current mode input circuit (i.e. to the load node $16_A$) is a portion of the current $I_{DC}$. For higher resolution applications (taking the ADC application as an example) it is useful to scale the current supplied to the load node $16_A$ (for example, in an ADC the thermal noise of the sampling capacitor is a limit and therefore a higher capacitance value for the sampling capacitor may be required which requires a much higher value of the current $I_{DC}$. In order to increase the value of $I_{DC}$, the voltage drop of the resistors $21_A$ and $31_A$ must be reduced. This will result in a lower characteristic impedance seen looking into the input node $14_A$ from the input terminal $15_A$ (e.g. less than a desired 50 Ohm). This makes the shunting capacitor $33_A$ much less effective. That is, to achieve a reasonable effect using the shunting capacitor $33_A$ in view of the lower characteristic impedance, the shunting capacitor $33_A$ would need to be very large, which is not feasible in practice since such a large capacitor $33_A$ would give rise to much more parasitic capacitance and thereby degrade the bandwidth of the sampler circuitry 100, which is not desirable. Moreover, the stacking of the devices in the sampler circuit 100 would be much more difficult with higher currents.

To overcome some of these disadvantages (among others), two example arrangements are disclosed herein.

Figure 5:
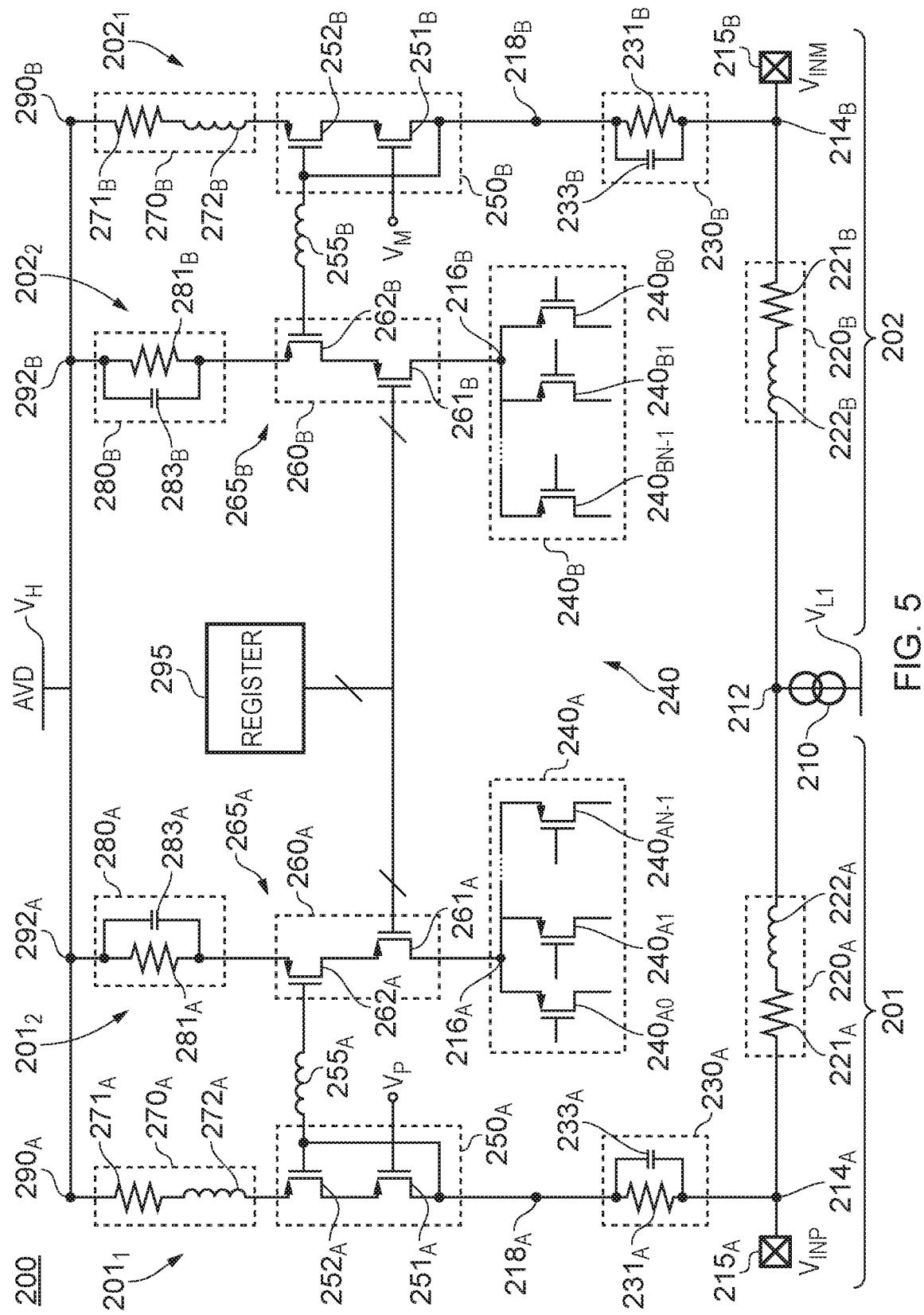
FIG. 5 is a schematic diagram of a first example arrangement of sampler circuitry.

FIG. 5 is a schematic diagram of a first example arrangement 200 of sampler circuitry.

Sampler circuitry 200 is shown in FIG. 5 as differential circuitry operable based on a differential input voltage signal. Sampler circuitry 200 can also be provided as single-ended circuitry operable based on a single-ended input voltage signal.

It will become apparent that the sampler circuitry 200 is similar to the circuitry 100, but uses a current mirror approach to address the above-mentioned problems. The current mirror enables the circuit to have a "folded" structure. As explained in more detail below, the current mirror also provides additional gain. Further, the various impedances impact the operation to provide gain boosting at high frequencies as compared to at low frequencies.

Sampler circuitry 200 comprises two matching (or corresponding or complementary) sections 201 and 202 for the two differential inputs, similar to the circuitry 100.

The first section 201 comprises an input node $214_A$, a mirror node $218_A$, a first impedance $220_A$, a second impedance $230_A$, a third impedance $270_A$, a fourth impedance $280_A$, current mirror circuitry $265_A$, a primary reference node $290_A$, a secondary reference node $292_A$, a load node $216_A$ and load circuitry $240_A$.

The input node $214_A$ is configured to receive an input voltage signal $V_{INP}$ via a terminal $215_A$. The input node $214_A$ and the terminal $215_A$ as shown in FIG. 5 are provided separately but they could be the same. The input node $214_A$ is connected to a tail node 212 via the first impedance 220A. The tail node 212 is connected via a current source 210 to a voltage reference (power supply node) $V_L$ whose voltage level is below that of $V_{INP}$ (and $V_{INM}$). In particular, current source 210 supplies a constant DC current $I_{DC}$ to the sampler circuitry 200. The current $I_{DC}$ may be referred to as a bias current or as a sampler current in some examples. The input node $214_A$ is connected to the mirror node $218_A$ via the second impedance $230_A$. The mirror circuitry $265_A$ comprises a primary side $250_A$ connected between the mirror node $218_A$ and the third impedance $270_A$, and a secondary side $260_A$ connected between the load node $216_A$ and the fourth impedance $280_A$. The primary side $250_A$ is connected to the primary reference node $290_A$ via the third impedance $270_A$. The secondary side $260_A$ is connected to the secondary reference node $292_A$ via the fourth impedance $280_A$. The load circuitry $240_A$ is connected to the load node $216_A$.

The primary and secondary reference nodes $290_A$ and $292_A$ are connected to voltage references (power supply nodes). Here it is assumed that the references nodes (power supply nodes) $290_A$ and $292_A$ are connected to the same voltage reference (power supply node) $V_H$ which may be referred to as a high voltage reference. The load circuitry $240_A$ (or subsequent circuitry connected beyond the load circuitry 240) will of course be connected to a voltage reference (power supply node) $V_{L2}$ whose voltage level is below that of the voltage reference (power supply node) $V_H$ and which may be referred to as a low voltage reference. Here it is assumed that the voltage references (power supply nodes) $V_{L1}$ and $V_{L2}$ are connected to the same voltage reference (power supply node) $V_L$ which may be referred to as the low voltage reference (e.g. GND), although different voltage levels for $V_{L1}$ and $V_{L2}$ could be provided.

The first section 201 can be described as comprising a primary current path $201_1$ connected between high and low voltage references $V_H$ and $V_{L1}$ and a secondary current path $201_2$ connected between high and low voltage references $V_H$ and $V_{L2}$. The input node $214_A$, the mirror node $218_A$, the first impedance $220_A$, the second impedance $230_A$, the third impedance $270_A$, and the primary side $250_A$ of the current mirror circuitry $265_A$ are connected along the primary current path $201_1$. The fourth impedance $280_A$, the secondary side $260_A$ of the current mirror circuitry $265_A$, the load node $216_A$ and the load circuitry $240_A$ are connected along the secondary current path $201_2$. The primary current path $201_1$ is configured to carry a primary current dependent on the input voltage signal $V_{INP}$. The current mirror circuitry $265_A$ is connected to receive the primary current at its primary side $250_A$ and to output a secondary current at its secondary side $260_A$ (that is, a secondary current dependent upon the primary current is caused to flow along the secondary current path $201_2$). The tail node 212 and the current source 210 may be considered connected along the primary current path $201_1$ and the current source 210 configured to define a bias current flowing along that path. The input node $214_A$ may be considered located along the primary current path $201_1$ so as to divide the primary current path into first and second portions, the first portion of the primary current path $201_1$ configured to carry the primary current, the primary side $250_A$ of the current mirror circuitry $265_A$ connected along the first portion of the primary current path $201_1$, and the first impedance $220_A$ connected along the second portion of the primary current path $201_1$.

The second section 202 has a corresponding arrangement (with like elements denoted with a subscript B rather than a subscript A) as shown in FIG. 5, including an input node $214_B$ to receive an input voltage signal $V_{INM}$. A detailed description of the second section 202 is therefore omitted. Input voltage signals $V_{INP}$ and $V_{INM}$ are the "plus" and "minus" components of the (differential) input voltage signal.

Sampler circuitry 200 comprises load circuitry 240. As shown in FIG. 5, load circuitry 240 corresponds closely to the load circuitry 40 in FIG. 4, and equivalent considerations apply. That is, the switches $240A_0$ to $240A_{N-1}$ and $240B_0$ to $240B_{N-1}$ may be referred to as sampling switches or sampler switches; these sampling switches may be the sampling switches of a current-mode sampler corresponding to sampler 42 (in such a case the sampling switches $240A_0$ to $240A_{N-1}$ and $240B_0$ to $240B_{N-1}$ may be controlled by time-interleaved clock signals). The load circuitry 240 comprises the load circuitry $240_A$ of the first section 201 and the load circuitry 240B of the second section 202 as shown in FIG. 5. The load circuitry 240 as depicted in FIG. 5 is however an example and in general may comprise any current-mode circuitry.

Sampler circuitry 200 basically works in a similar way to the sampler circuitry 100: by receiving the input voltage signal and by employing impedances to passively convert the received input voltage signal into an equivalent input current signal. For example, a current signal is received by the load circuitry $240_A$ at the load node $216_A$. The secondary current at least partly forms the current signal. In a differential implementation, for example, a differential current signal is received by the load circuitry at the load nodes $216_A$ and $216_B$ (and the secondary currents output by the secondary sides $260_A$ and $260_B$ of the current mirror circuitry $265_A$ and $265_B$, respectively, at least partly form the differential current signal). In this regard, sampler circuitry 200 may be considered to comprise voltage-to-current conversion circuitry, with its output being the current signal received by the load circuitry 240 between or at the load nodes $216_A$ and $216_E$. Further, the sampler circuitry 200 may be referred to simply as circuitry or a circuitry system. In the following description it is assumed for convenience that the current signal received by the load circuitry $240_A$ is the same as the secondary current (and this may be referred to as a load current), with an equivalent assumption holding for the second section 202.

The first to fourth impedances $220_A$, $230_A$, $270_A$ and $280_A$ are shown in FIG. 5 as comprising particular combinations of resistor, capacitor and/or inductor. However, as discussed above with regard to the first and second impedances $20_A$ and $30_A$ of sampler circuitry 100, any component(s) giving rise to an impedance may be used to implement the first to fourth impedances $220_A$, $230_A$, $270_A$ and $280_A$. Further, the third and fourth impedances $270_A$ and $280_A$ are not essential. Equivalent considerations apply to the first to fourth impedances $220_B$, $230_B$, $270_B$ and $280_B$ of the second section 202.

The primary and secondary reference nodes $290_A$ and $292_A$ of the first section 201 and the primary and secondary reference nodes $290_B$ and $292_B$ of the second section 202 as shown in FIG. 5 are all connected to the same voltage reference (power supply node) $V_H$ (AVD). However, the reference nodes $290_A$, $292_A$, $290_B$ and $292_B$ may each be connected to voltage references (power supply nodes) different to or the same as any other reference node $290_A$, $292_A$, $290_B$ and $292_B$.

As described above, sampler circuitry 200 can also be provided as single-ended circuitry operable based on a single-ended input voltage signal and operable to output a single-ended current signal (load current). That is, single-ended sampler circuitry may comprise the first section 201, the current source 210, the tail node 212 and load circuitry (e.g. the load circuitry $240_A$), i.e. without the second section 202. The following description of the operation of the sampler circuitry 200 will be understood to apply equally to a single-ended implementation.

A brief summary of the operation of sampler circuitry 200 is as follows, focusing on the first section 201 by way of example (a corresponding explanation applies for the second section 202). Further, the following description is mainly focused on the differences between this first example arrangement 200 and sampler circuitry 100 shown in FIG. 4. The current generated with the second impedance $230_A$ (the primary current) is injected to the (advantageously wide swing) current mirror circuitry $265_A$ at its primary side $250_A$ and is multiplied and copied and at its secondary side $260_A$. In other words, the secondary current is caused to flow along the secondary current path $201_2$. The gain of the secondary current compared to the primary current is defined as G. The maximum value of G is n/m, where n and m are the number of unit devices (transistors, such as field-effect transistors) on the secondary and primary sides $260_A$ and $250_A$ of the current mirror circuitry $265_A$, respectively. On the primary side $250_A$, transistor $252_A$ is the diode connected device and transistor $251_A$ is the cascode for the primary side $250_A$. On the secondary side $260_A$, the transistor $262_A$ is the mirror device and transistor $261_A$ is the cascode for the secondary side $260_A$.

Ignoring the third and fourth impedances $270_A$ and $280_A$ and the inductor $255_A$, the devices $251_A$, $252_A$, $261_A$ and $262_A$ form a wide swing current mirror which mirrors the input-dependent current (the primary current) with the gain of G to form the secondary current. In the sampler circuitry 200, both the DC and the AC amplitude of the primary current is multiplied with the same factor. This is appropriate for the example in which the load circuitry 240 comprises sampler switches constituting an ADC front-end where the output load is defined by the sub-ADC sampling capacitance. This ability to amplify the primary current solves the problem associated with the third disadvantage described above. That is, the amount of current at the load node $216_A$ can be increased without the need to increase the current generated at the current source 210 (i.e. the bias current $I_{Dc}$), and therefore the values of the first and second impedances $220_A$, $230_A$ do not need to be changed to account for a change in the current $I_{DC}$. Thereby a larger secondary current is achieved with an advantageous S11 value and bandwidth.

The sampler circuitry 200 also solves the problem associated with the second disadvantage mentioned above. In particular, the splitting of the stacking into the primary and secondary current paths $201_1$ and $201_2$ (i.e. "folding") solves this problem. As mentioned above, the primary current path $201_1$ comprises the input node $214_A$, the mirror node $218_A$, the first impedance $220_A$, the second impedance $230_A$, the third impedance $270_A$, and the primary side $250_A$ of the current mirror circuitry $265_A$, each connected therealong. For example with a 1.8 V supply voltage (i.e. AVD=1.8 V), this part of the sampler circuitry 200 (the primary current path $201_1$) can be designed without any voltage headroom problem. This design relaxation is such that the bias current $I_{DC}$ can be generated (by current source 210) using a simple current mirror without the need for a DC control loop, for example. As mentioned above, the secondary current path $201_2$ comprises the fourth impedance $280_A$, the secondary side $260_A$ of the current mirror circuitry $265_A$, the load node $216_A$ and the load circuitry $240_A$, each connected therealong. The secondary current path $201_2$ may also effectively comprise any subsequent circuitry connected beyond the load circuitry $240_A$, for example (sub-) ADC circuitry. Importantly, the secondary current path $201_2$ need not (and does not) comprise elements of the primary current path $201_1$ such as the first impedance $220_A$, the second impedance $230_A$, and the current source $210$.

A mirror voltage signal $V_P$ input at the gate of transistor $251_A$ may be generated with a DC control loop circuit (not shown) and controls the transistor $251_A$ so that it is on the border of triode and saturation. This guarantees a high resolution operation of the current mirror circuitry $265_A$ and therefore of the sampler circuitry $200$. The transistor $261_A$ is controlled by the register $295$ as shown in FIG. 5. The register $295$ generates either a supply voltage (e.g. having the same value, AVD, as $V_H$) or a defined bias voltage (which may also be generated by a control loop circuit, not shown in FIG. 5) for input at the gate of transistor $261_A$. When the register $295$ (depending on a value it stores) generates the supply voltage at the gate of transistor $261_A$, the transistor $261_A$ is OFF, and when the register $295$ generates a bias voltage at the gate of transistor $261_A$, the transistor $261_A$ is ON (to a defined level). The amount of gain G of the current mirror circuitry $265_A$ varies accordingly (assuming transistor $261_A$ is implemented as a plurality of devices which can be controlled separately as mentioned below). Although not shown in FIG. 5, it will be understood that the voltages supplied from the register $295$ to the transistors $261A$ and $261B$ could be different from one another, i.e. optimised for the relevant circuit section $201$, $202$. The register $295$ may be referred to as or form part of control circuitry. Control circuitry may comprise the register $295$ as well as any DC control loops described above.

It will be appreciated that any of transistors $251_A$, $252_A$, $261_A$ and $262_A$ may correspond to a plurality of transistors/devices. In particular, transistor $261_A$ may correspond to a plurality of transistors/devices, in which case the register $295$ controls individual transistors/devices as described above (i.e. generating a supply voltage or a bias voltage at the gates of individual transistors/devices to switch some or all of them OFF and some or all of them ON) in order to vary the gain G of the current mirror circuitry $265_A$. This control of the gain G of the current mirror circuitry $265_A$ brings programmability to the sampler circuitry $200$. With such programmability of the sampler circuitry $200$, programmability can be removed from (or simplified in) the current-mode circuitry being driven (i.e. the load circuitry), including any subsequent circuitry, for example, a (sub-) ADC. This enables the design of the current-mode circuitry being driven to be more compact and efficient, especially for higher resolution applications. Moreover, the amount of current at the load node $216_A$ (i.e. the magnitude of the secondary/load current) can be adjusted to compensate for loss due to parasitic capacitance and any other effects which might degrade the signal level supplied to, for example, a (sub-) ADO front-end (i.e. load circuitry $240_A$ and subsequent circuitry). That is, calibration can be performed to tune out parasitic capacitances and other effects that reduce the magnitude of or otherwise degrade the secondary/load current.

The function of the first and second impedances $220_A$ and $230_A$ (in particular the inductor $222_A$ and the capacitor $233_A$) is substantially the same as that of the first and second impedances $20_A$ and $30_A$ described above with reference to FIG. 4. A detailed description of the operation of the first and second impedances $220_A$ and $230_A$ is therefore omitted. In addition to the gain that can be added (in the sense of boosting the gain at high frequencies relative to at low frequencies) by the configuration of the first and second impedances $220_A$ and $230_A$ as shown in FIG. 5, more gain can be added (in the sense of high-frequency boosting) by using the configuration of the third and fourth impedances $270_A$ and $280_A$ shown in FIG. 5, and also by using the inductor $255_A$ in the current mirror circuitry $265_A$, as follows.

The inductor $255_A$ between the gates of transistors $252_A$ and $262_A$ (and preferably using as the inductor $255_A$ a fairly high-Q inductor with a small inductance) provides a mid-frequency resonance with the gate-source capacitance of the transistor $262_A$. In other words, the inductor $255_A$ "tunes out" the gate-source capacitance of the transistor $262_A$. This results in peaking in the secondary current, and also compensates for the low frequency operation of the current mirror circuitry $265_A$. Thus the inductor $255_A$ extends the bandwidth of the current mirror circuitry $265_A$.

The inductor $272_A$ connected between the source of the transistor $252_A$ and the primary reference node $290_A$ (and preferably using as the inductor $272_A$ a medium-sized inductor (relatively speaking)) provides high frequency source degeneration which boosts the gate voltage of the transistor $262_A$ (and also the gate voltage of transistor $252_A$ since the gates of transistors $262_A$ and $252_A$ are connected together via the inductor $255_A$). This also provides some gain boosting at high frequency (i.e. boosting of the gain at high frequencies relative to at low frequencies) in the secondary current depending on the size of the inductor $272_A$.

The resistors $271_A$ and $281_A$ connected between the source of the transistor $252_A$ and the primary reference node $290_A$, and between the source of the transistor $262_A$ and the secondary reference node $292_A$, respectively (preferably small (high current) resistors), act as degeneration resistors. The resistor $281_A$ on the secondary side $201_2$ is shunted with the capacitor $283_A$ connected in parallel with the resistor $281_A$ (preferably the capacitor $283_A$ is a small capacitor, relatively speaking). At high frequency (of the input voltage signal $V_{INP}$), the shunting capacitor $283_A$ removes the degeneration in the source of the transistor $262_A$ which in turn increases the gain of the current mirror circuitry $265_A$. Preferably, the resistance values of the resistors $271_A$ and $281_A$ are scaled so that the resistance value of the resistor $281_A$ is smaller than the resistance value of the resistor $271_A$ by a factor of G (the gain of the current mirror circuitry $265_A$), for example to provide improved matching and to stabilise the gain. Using the resistors $271_A$ and $281_A$ to boost the gain (at high frequencies relative to at low frequencies) does consume some voltage headroom which could be noticeable, especially in the secondary current path $201_2$. Further, when the sampler circuitry $200$ is operated with a high current, low resistance value and high current resistors are required for the resistors $271_A$ and $281_A$—which can be difficult to implement in some practical arrangements.

For some implementations the resistors $271_A$ and $281_A$ are not employed. In other words, the inductors $255_A$ and $272_A$ may add sufficient gain to the current mirror circuitry $265_A$. As mentioned above, the first to fourth impedances $220_A$, $230_A$, $270_A$ and $280_A$ may have configurations other than those depicted in FIG. 5, and the sampler circuitry $200$ may not comprise the third and fourth impedances $270_A$ and $280_A$.

In terms of the S11 parameter, the inductor $272_A$ increases the impedance seen at high frequencies from the drain of the transistor $251_A$. This increase compensates for the impedance decrease seen at high frequencies due to the shunting capacitor $233_A$ (the description of which is analogous to that of the shunting capacitor $33_A$ above), and therefore the inductor $272_A$ provides improved matching and thereby improves the S11 parameter. At the same time, due to source degeneration as described above, the inductor $272_A$ increases the gain boosting at high frequencies (i.e. boosting of the gain at high frequencies relative to at low frequencies). Therefore, the inductor $272_A$ can improve both the gain profile and S11 parameter. This relaxes the above mentioned S11-gain trade-off (the first disadvantage described above of the sampler circuitry 100). Moreover, in the sampler circuitry 200 the load circuitry 240, is connected to the secondary side $260_A$ of the current mirror $265_A$ (along the secondary current path $201_2$) which makes the S11 parameter independent of effects from the load circuitry $240_A$ (e.g. the $g_m$ (transconductance) of the sampling switches $240_{A0}$ to $240_{AN-1}$). This relaxes the conditions for ensuring a good S11 parameter.

As described above, an advantage of the sampler circuitry 200 (compared to the sampler circuitry 100) is the extra amount of gain. This additional gain improves the bandwidth of the sampler circuitry 200, and the bandwidth can be brought towards the Nyquist rate at high ADC sample rates.

Figure 6A:
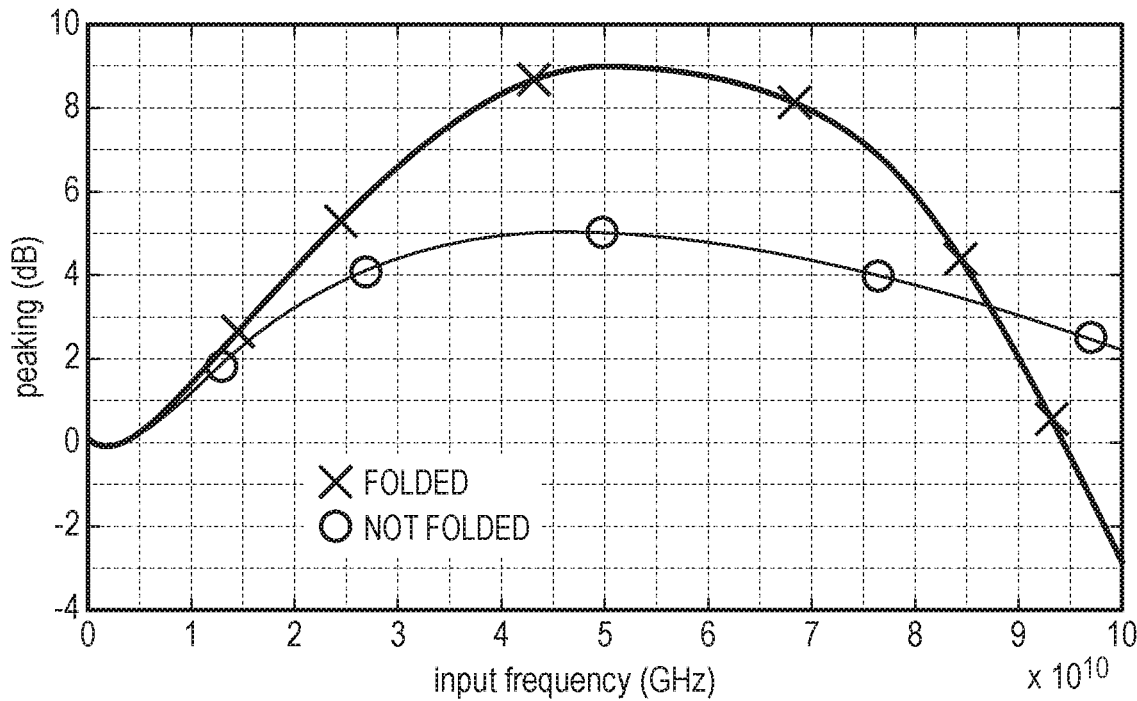
FIGS. 6A and 6B are graphs useful for understanding the sampler circuitry of FIG. 5.

FIG. 6A is a graph showing the peaking in the secondary/load current for an implementation of the sampler circuitry 100 (not folded) and for an implementation of the first example arrangement of sampler circuitry 200 (folded) for a 128 GSa/s ADC design example (i.e. with the load circuitry 240 configured as a sampler with a 128 GSa/s sample rate). As can be seen, more than 4 dB of gain is added into the signal path in the sampler circuitry 200 compared to the sampler circuitry 100 in these implementations.

Figure 6B:
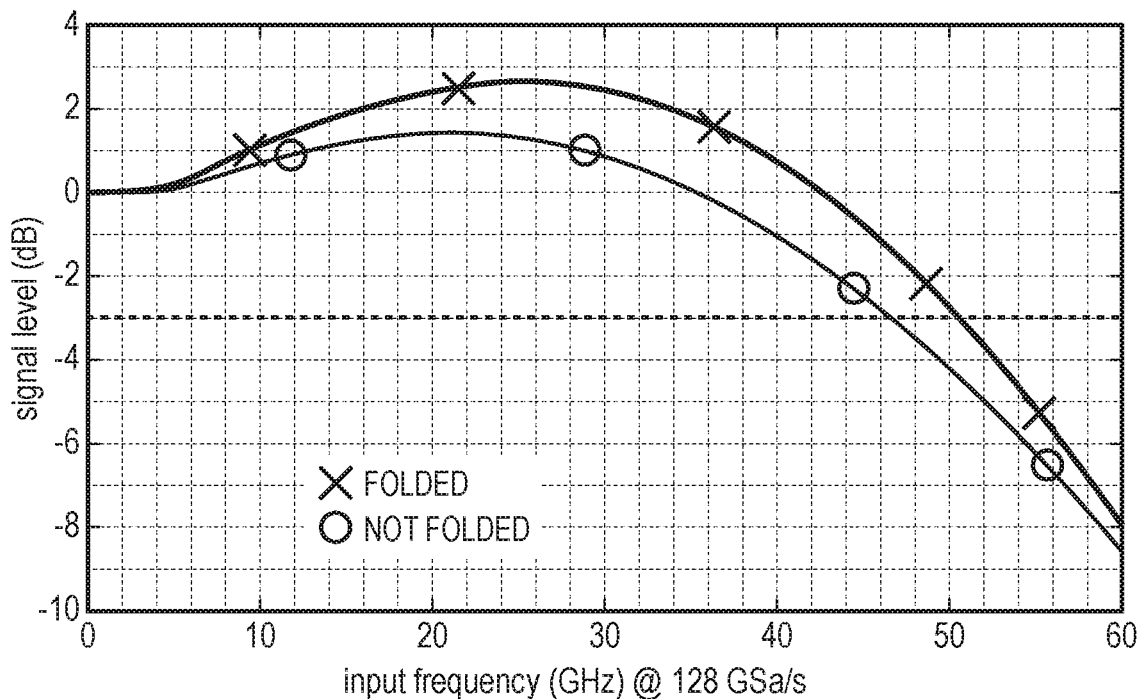

FIG. 6B is a graph showing the bandwidth of an implementation of the sampler circuitry 100 (not folded) and for an implementation of the first example arrangement of sampler circuitry 200 (folded) for the 128 GSa/s design example. It is apparent from FIG. 6B (considering e.g. the −3 dB level) that the bandwidth of the sampler circuitry 200 is improved compared to that of the sampler circuitry 100 (it can be seen that the bandwidth is improved by at least 4 GHz for these example implementations).

The gain provided in the first example arrangement 200 allows the input voltage level to be reduced (whilst achieving the same output level) compared to the sampler circuitry 100. This reduces the amount of harmonics injected ultimately into the current signal that is to be provided to the load circuitry 240 (i.e. the secondary/load current) which in turn improves the effective resolution of the sampler circuitry 200 (in particular of the sampler implemented by way of the load circuitry 240). This is appropriate for low speed (low bandwidth) applications where a higher effective number of bits (ENOB) is normally required.

Figure 7A:
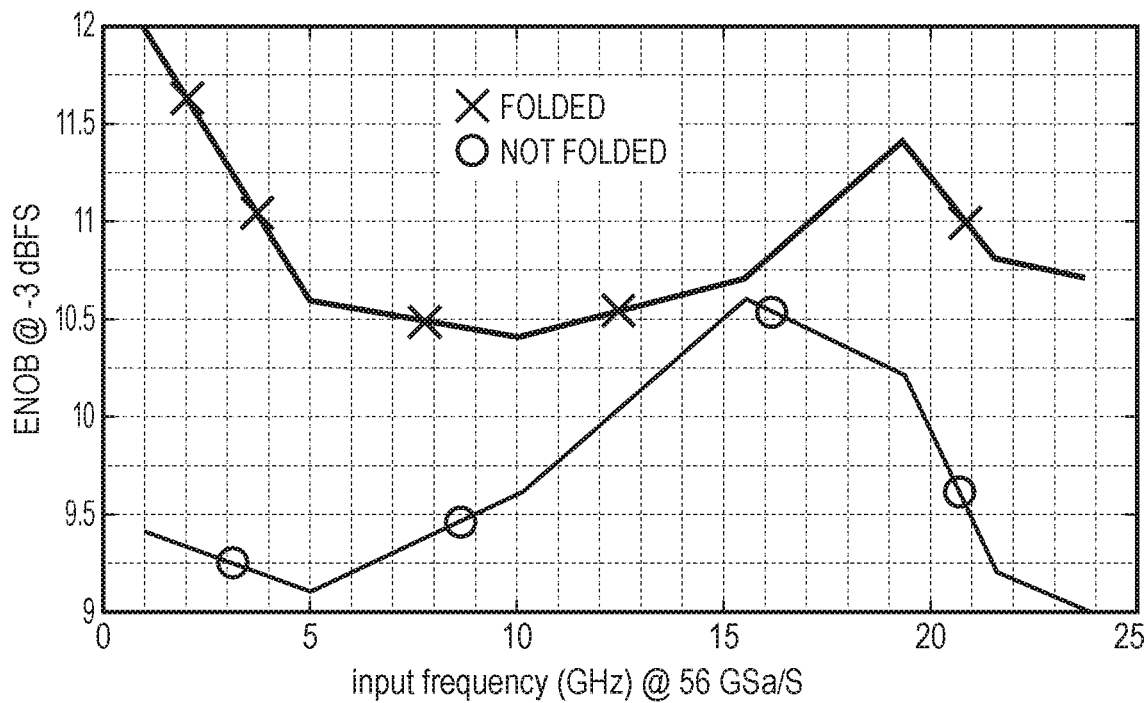
FIGS. 7A and 7B are graphs useful for understanding the sampler circuitry of FIG. 5.

FIG. 7A is a graph showing the ENOB of an implementation of the sampler circuitry 100 (not folded) and of an implementation of the first example arrangement of sampler circuitry 200 (folded) in a 56 GSa/s ADC design example in which the output is kept at −3 dBFS (3 dB lower than full scale). As can be seen in FIG. 7A, the first example arrangement 200 provides an improved ENOB compared to the sampler circuitry 100 across a wide range of input frequencies. In particular, at low (lower) input frequencies, the ENOB provided by the first example arrangement 200 is around 2.5 bits higher than the ENOB provided by the sampler circuitry 100 for these example implementations. In this implementation of the first example arrangement 200, the gain of the current mirror circuitry $265_A$ is set to G=2.5 dB.

Figure 7B:
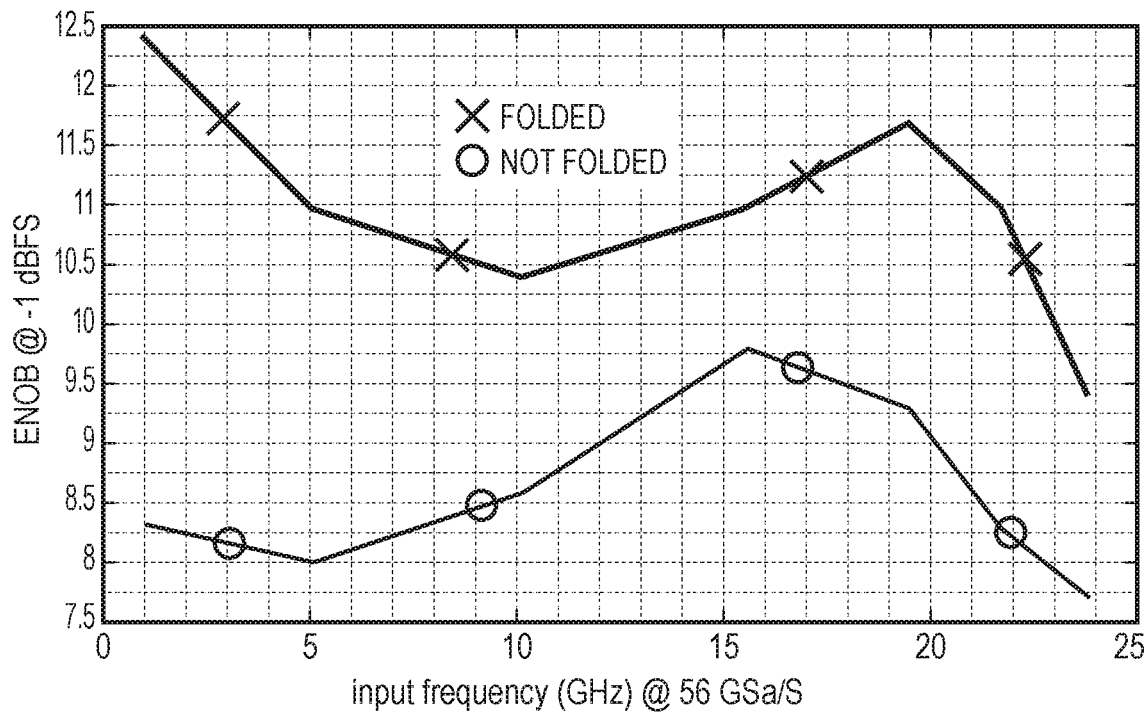

FIG. 7B is a graph showing the ENOB of an implementation of the sampler circuitry 100 (not folded) and of an implementation of the first example arrangement of sampler circuitry 200 (folded) in a 56 GSa/s ADC design example in which the output is kept at −1 dBFS (1 dB lower than full scale). In this implementation of the first example arrangement 200, the gain of the current mirror circuitry $265_A$ is set to G=6 dB. As can be seen in FIG. 7B, the ENOB improvement provided by the example arrangement 200 compared to the sampler circuitry 100 is better than that provided by the example arrangement 200 as implemented for FIG. 7A, due to the higher gain G of the current mirror circuitry $265_A$. In this implementation of the first example arrangement 200, at low (lower) frequencies, the ENOB provided is enhanced by around 4 bits compared to the ENOB provided by the sampler circuitry 100.

Figure 8:
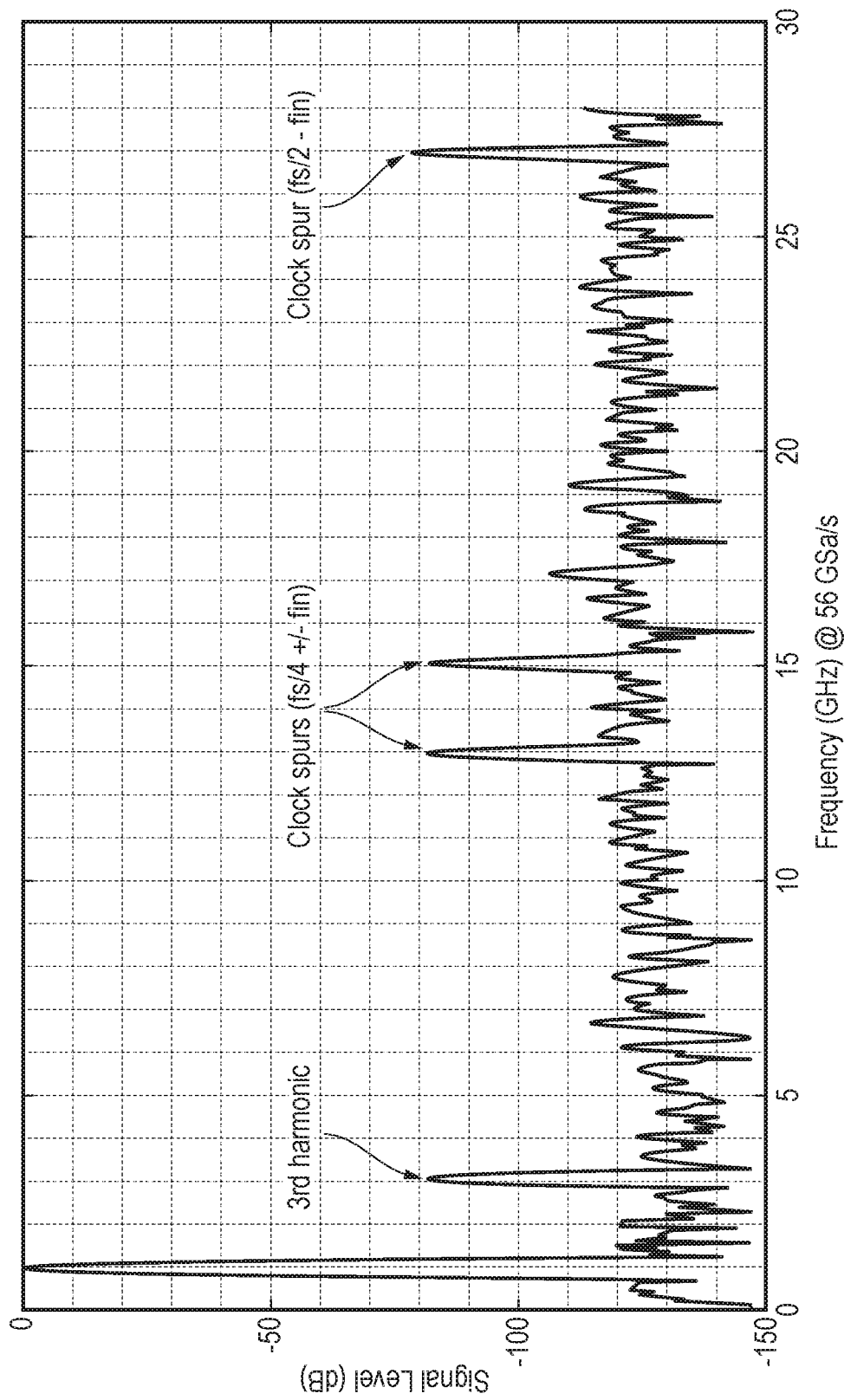
FIG. 8 is a graph useful for understanding the sampler circuitry of FIG. 5.

FIG. 8 is a graph showing the current output signal level of an implementation of the first example arrangement of sampler circuitry 200 in a 56 GSa/s ADC design example in which (as an extreme example to illustrate the ENOB enhancement) the gain of the current mirror circuitry $265_A$ is increased to G=9.5 dB. This allows the input signal level $V_{INP/M}$ to be reduced by more than 9 dB. As can be seen in FIG. 8, this practically pushes the harmonics (i.e., mainly the third harmonic) lower than the clock spurs (shown at fs/4+fin, fs/4-fin and fs/2-fin, where fs is the sampling frequency and fin is the frequency of the input signal, and the Nyquist frequency fs/2=28 GHz). This corresponds to a sampler design with no or negligible harmonic distortion.

In summary, some of the advantages of the first example arrangement 200 (which may be referred to as an ultra high frequency, programmable equalizer, folded structure with high linearity) compared to, for example, the sampler circuitry 100 are as follows.

Gain enhancement. The current mirror circuitry $265_A$ can provide gain. Also, other components (e.g. impedances) can provide gain boosting at high frequencies without affecting the S11 parameter due to solving the problem of trade-off between gain and S11 by using the primary and secondary current paths $201_1$ and $201_2$.

Improved linearity. Due to the improved gain the input voltage level $V_{INP/M}$ can be reduced whilst still achieving a sufficient output current signal level, so that there is less distortion in the output signal level. Therefore the linearity in the secondary/load current and therefore in the current signal input to load circuitry $240_A$ is improved.

Programmability. The current mirror circuitry $265_A$ can be controlled as described above in order to adjust the gain G. This adjustment can be used to compensate for loss due to parasitic capacitance and any other effects which might degrade the output signal level.

Sample frequency tuning. Due to the programmability of the current mirror circuitry $265_A$, the gain G of the current mirror circuitry $265_A$ can be adjusted according to the sample frequency. Considering an example in which the load circuitry corresponds to sampling switches of a sub-ADC, without this programmability the capacitance value of the sub-ADC sampling capacitor would need to be adjusted according to the sample frequency (higher sample frequencies mean lower integration time and so a lower capacitance value of the sub-ADC sampling capacitor would be required, e.g. to achieve the same input voltage swing). However due to the programmability of the gain G of the current mirror circuitry $265_A$, the capacitance value of the sub-ADC sampling capacitor (considering an example in which the load circuitry corresponds to sampling switches of a sub-ADC) can be fixed and instead the gain of the current mirror circuitry $265_A$ can be adjusted according to the sample frequency.

Bandwidth extension. The bandwidth can be extended due to the improved gain profile (i.e. the added gain, and the boosting of gain at high frequencies relative to at low frequencies) and due to the improved S11 parameter.

Figure 9:
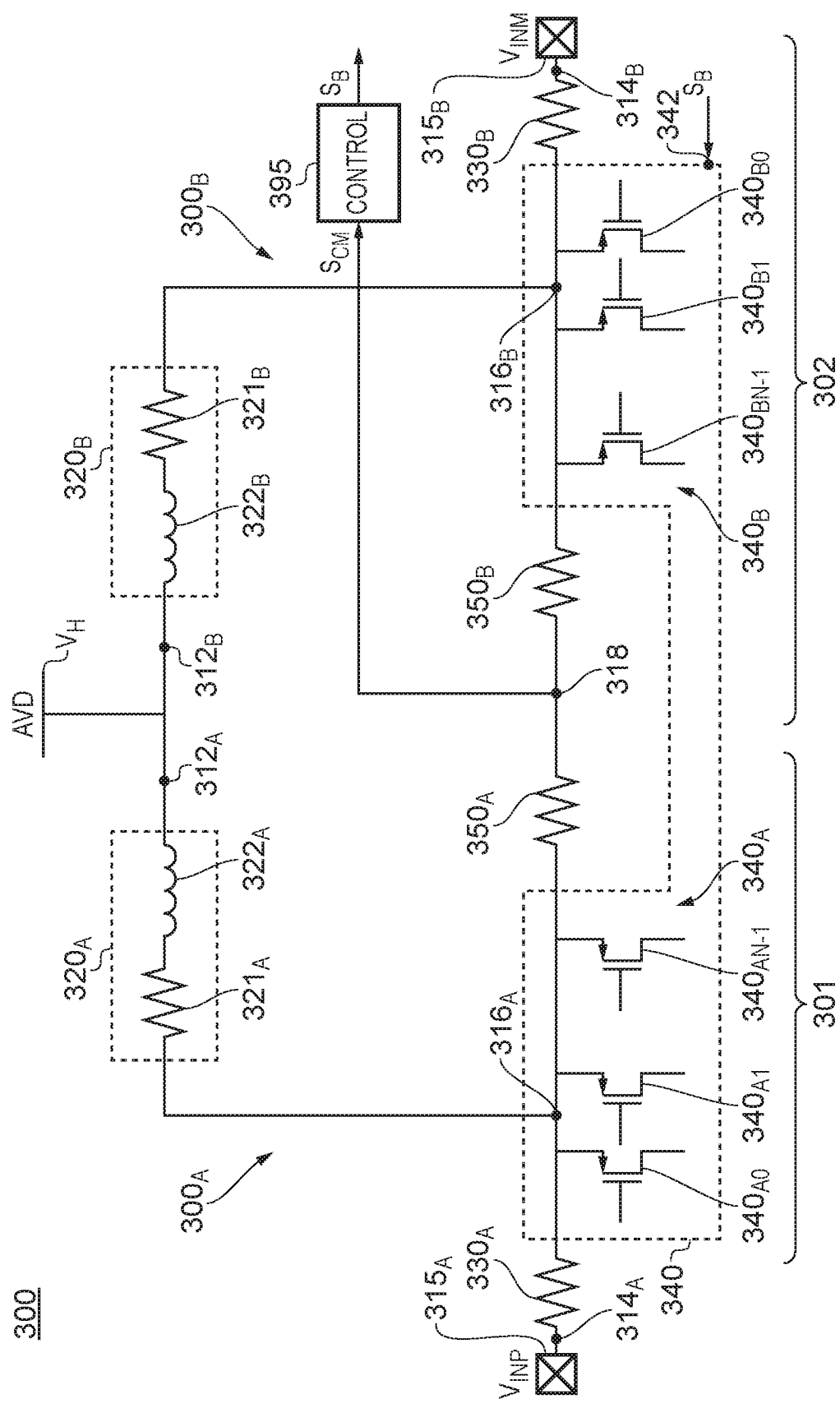
FIG. 9 is a schematic diagram of a second example arrangement of sampler circuitry.

Decoupling of S11 performance from the load circuitry 240. Due to the "folding" of the first example arrangement (i.e. the current mirror circuitry $265_A$, giving rise to the first and second current paths $201_1$ and $201_2$), the S11 parameter is not affected by the load circuitry $240_A$ and subsequent circuitry which is connected along the secondary current path ($201_2$). This relaxes the conditions for ensuring a good S11 parameter, FIG. 9 is a schematic diagram of a second example arrangement 300 of sampler circuitry.

Sampler circuitry 300 is differential circuitry operable based on a differential input voltage signal. Sampler circuitry 300 comprises control circuitry 395 and two matching (or corresponding or complementary) sections 301 and 302 for the two differential inputs, similar to the circuitry 100.

The first section 301 comprises an input node $314_A$, an intermediate node $316_A$, a tail node $312_A$, an input-connection impedance $330_A$, a supply-connection impedance $320_A$, a measurement impedance $350_A$ and load circuitry $340_A$. The intermediate node $316_A$ as shown in FIG. 9 may be referred to as a load node.

The input node $314_A$ is configured to receive an input voltage signal $V_{INP}$ via a terminal $315_A$. The input node $314_A$ and the terminal $315_A$ as shown in FIG. 9 are provided separately but they could be the same as one another. The intermediate node $316_A$ is connected to the tail node $312_A$ via the supply-connection impedance $320_A$. The input node $314_A$ is connected to the intermediate node $316_A$ via the input-connection impedance $330_A$. The intermediate node $316_A$ is connected to a measurement node 318 via the measurement impedance $350_A$.

The input-connection, supply-connection, and measurement impedances $330_A$, $320_A$ and $350_A$ are shown in FIG. 9 as comprising particular combinations of resistor, capacitor and/or inductor. Similarly as discussed above with regard to the sampler circuitry 100 and 200, any component(s) giving rise to an impedance may be used to implement the impedances $320_A$, $330_A$ and $350_A$. In particular, the input-connection impedance $330_A$ may comprise a capacitor (not shown) connected in parallel with the resistor.

The second section 302 has a corresponding arrangement as shown in FIG. 9, the measurement node 318 being shared between the first and second sections 301 and 302. A detailed description of the second section 302 is therefore omitted. Input voltage signals $V_{INP}$ and $V_{INM}$ are the "plus" and "minus" components of the (differential) input voltage signal.

The nodes $314_A$, $316_A$ and $312_A$, the impedances $320_A$, $330_A$ and $350_A$, and the load circuitry $340_A$ of the first section 301 may be labelled with the prefix "first" and nodes $314_B$, $316_B$ and $312_B$, impedances $320_B$, $330_B$ and $350_B$, and load circuitry $340_B$ of the second section 302 may be labelled with the prefix "second" to distinguish elements of the first and second sections 301 and 302 from each other. The first and second tail nodes $312_A$ and $312_B$ may be connected to the same voltage reference or power supply node $V_H$ (e.g. AVD as shown in FIG. 9) and thereby may be referred to together as a tail node 312. First and second load circuitry $340_A$ and $340_B$ may be referred together as load circuitry 340. Load circuitry 340 comprises a biasing node 342. The load circuitry 340 (or subsequent circuitry connected beyond the load circuitry 340) will of course be connected to a voltage reference (power supply node) $V_L$ whose voltage level is below that of the voltage reference (power supply node) $V_H$. The voltage reference (power supply node) $V_H$ may be referred to as a high voltage reference and the voltage reference (power supply node) $V_L$ may be referred as a low voltage reference, and the potential difference between $V_H$ and $V_L$ may be referred to as the supply voltage.

The first section 301 can be described as comprising a first current path $300_A$ extending from the tail node 312 via the first intermediate node $316_A$ to a first load node (which as shown in FIG. 9 is the same as the first intermediate node $316_A$ but may be provided separately from the first intermediate node 316A) to provide a first load current at the first intermediate (or load) node $316_A$ for use by the load circuitry 340, wherein the first supply-connection impedance $320_A$ is connected along the first current path $300_A$ between the tail node 312 and the first intermediate node $316_A$.

The second section 302 can be described as comprising a second current path $300_B$ extending from the tail node 312 via the second intermediate node $316_B$ to a second load node (which as shown in FIG. 9 is the same as the second intermediate node $316_B$ but may well be provided separately from the second intermediate node $316_B$) to provide a second load current at the second intermediate (or load) node $316_B$ for use by the load circuitry 340, wherein the second supply-connection impedance $320_B$ is connected along the second current path $300_B$ between the tail node 312 and the second intermediate node $316_B$. The first and second load currents define a differential current signal upon which the load circuitry 340 is configured to operate. The first and second input nodes $314_A$ and $314_B$ are connected to the first and second intermediate nodes $316_A$ and $316_B$ via the first and second input-connection impedances $330_A$ and $330_B$, respectively, so that the differential current signal is dependent on the differential input voltage signal. The first and second load currents comprise respective DC bias current components (defined by the first and second supply-connection impedances $320_A$ and $320_B$, respectively, the voltage level of the voltage reference (power supply node) $V_H$, and a common-mode voltage indicative of a common mode between voltages at the first and second intermediate nodes $316_A$ and $316_B$), and also respective AC current components dependent on the differential input voltage signal ($V_{INP}$ and $V_{INM}$).

The control circuitry 395 is configured, based on measurement of the common mode voltage indicative of the common mode between voltages at the first and second intermediate nodes $316_A$ and $316_B$, to control a biasing signal $S_B$ provided to the biasing node 342 of the load circuitry 340 to regulate the common mode voltage. Effectively, the biasing signal $S_B$ biases (regulates) operation (e.g. an operating point) of the load circuitry 340 which in turn affects (regulates) the common mode voltage. A common mode control loop is thus implemented. Thereby, the DC bias current components of the first and second load currents are regulated, respectively. The control circuitry 395 may comprise the first and second measurement impedances $350_A$ and $350_B$.

The load circuitry 340 as shown in FIG. 9 corresponds closely to the load circuitry 40 in FIG. 4 and the load circuitry 240 in FIG. 5, and equivalent considerations apply. That is, the switches $340A_0$ to $340A_{N-1}$ and $340B_0$ to $340B_{N-1}$ may be referred to as sampling switches or sampler switches; these sampling switches may be the sampling switches of a current-mode sampler corresponding to sampler 42 (in such a case the sampling switches $340A_0$ to $340A_{N-1}$ and $340B_0$ to $340B_{N-1}$ may be controlled by time-interleaved clock signals). The load circuitry 340 of the sampler circuitry 300 may comprise any current-mode circuitry capable of receiving a biasing signal (e.g. the biasing signal $S_B$). The load circuitry 340 comprises the load circuitry $340_A$ of the first section 301 and the load circuitry $340_B$ of the second section 302 as shown in FIG. 9.

Sampler circuitry 300 basically works in a similar way to the sampler circuitry 100 and 200: by receiving the (differential) input voltage signal and by employing impedances to passively convert the received input voltage signal into an equivalent input current signal. For example, the input current signal is received by the load circuitry 340 between the load nodes $316_A$ and $316_B$ (and the input current signal may be referred to as a load current or as a differential current signal). In this regard, sampler circuitry 300 may be considered to comprise voltage-to-current conversion circuitry, its output being the current signal received by the load circuitry 340 between the load nodes $316_A$ and $316_B$ (the load current). Further, the sampler circuitry 300 may be referred to simply as circuitry or a circuitry system (for example, where the load circuitry 340 is current-mode circuitry other than sampler circuitry).

To describe in further detail the operation of the second example arrangement 300, reference is first made back to the sampler circuitry 100 of FIG. 4. In the following description, the shunting capacitors $33_A$ and $33_B$ of FIG. 4 are ignored for simplicity.

The current at the input node $14_A$ due to the input voltage signal $V_{INP}$ may be referred to as $I_{INP}$. Considering the first section 101 of the sampler circuitry 100 (with the understanding that the sampler circuitry 100 may be single-ended or differential and in the case of differential sampler circuitry 100 equivalent analysis applies to the second section 102), the proportion of the current $I_{INP}$ through the first and second impedances 20A and $30_A$ can be adjusted by appropriate selection of the first and second impedances $20_A$ and $30_A$ (in particular of the resistors $21_A$ and $31_A$). It is possible to select these impedances (resistors) for each application but difficult to make them switchable without affecting the bandwidth of the sampler circuitry 100 and parasitic capacitance (particularly at the input node). For the purpose of the following description it is assumed that the sampler circuitry 100 connects to the input of sub-ADC units (i.e. that the load circuitry 40 is a front-end sampler whose transistors serve as sampler switches which provide current pulse samples to sub-ADC units). It will be appreciated that a similar analysis could be applied for any current-mode circuit.

At low frequency of the (differential) input voltage signal, the portion $I_{2L}$ of the current $I_{INP}$ that flows towards the sampler switches (i.e. the input-dependent current at low frequency) can be calculated/approximated as (Equation 1):

$$I_{2L}=(R_2/(R_2+R_1+1/g_m))\times I_{INP}$$

where $R_1$ and $R_2$ are the resistance values of the resistors $31_A$ and $21_A$, respectively, and is the transconductance of the sampler switches.

At high frequency of the (differential) input voltage signal, ignoring the frequency response of the sampler switches, the portion $I_{2H}$ of the current $I_{INP}$ that flows towards the sampler switches (i.e. the input-dependent current at high frequency) can be calculated/approximated as (Equation 2):

$$I_{2L}=((R_2+L_1\times\omega)/(R_2+L_1\times\omega+R_1+1/g_m))\times I_{INP}$$

where $L_1$ is the inductance value of the inductor $22_A$ and $\omega=2\pi fin$, where fin is the input frequency, i.e. of the input voltage signal $V_{INP}$.

Assuming that at sufficiently high input frequencies ($\omega=2\pi fin$), $L_1$ is large enough such that (Equation 3):

$$R_2+L_1\times\omega>>R_1+1/g_m,$$

then Equation 2 can be approximated as follows (Equation 4):

The amount of high frequency gain achievable (i.e. the input-dependent current at high frequency compared to the input-dependent current at low frequency), taking into account the approximation (Equation 3) is Equation 4 divided by Equation 1. Therefore the amount of high frequency gain achievable $G_{MAX}$ is (Equation 5):

$$G_{MAX}=1+R_1/R_2+1/g_m R_2$$

Equation 5 shows the maximum gain achievable (i.e. the input-dependent current at high frequency compared to at low frequency) with the sampler circuitry 100. In practice the amount of gain achievable is limited by the desire for a good S11 parameter. A similar analysis can be carried out for S11 parameter calculation as follows. At low frequencies, the impedance $Z_{INL}$ (L for low frequency) seen looking into the input node $14_A$ from the input terminal $15_A$ can be calculated/approximated as (Equation 6):

$$Z_{INL}=(R_1+1/g_m)\|R_2=Z_0$$

where $\|$ means in parallel with, and where $Z_0$ (ohms) is the characteristic impedance of the system, such as an RF system, to be connected at the input (e.g. 50 ohm). At high frequencies, using the approximation of Equation 3, the impedance $Z_{INH}$ (H for high frequency) seen looking into the input node $14_A$ from the input terminal $15_A$ can be calculated/approximated as (Equation 7):

$$Z_{INH}=(R_1+1/g_m)\|(R_2+L_1\times\omega)\sim(R_1+1/g_m)$$

Using Equation 6 in Equation 7, the high frequency impedance $Z_{INH}$ can be calculated/approximated as (Equation 8):

$$Z_{INH}=Z_0\times R_2/(R_2-Z_0)$$

Therefore the reflection coefficient (S11 parameter) can be calculated as (Equation 9):

$$S11=(Z_{INH}-Z_0)/(Z_{INH}+Z_0)=Z_0/(2R_2-Z_0)$$

As an example, $R_1=50\Omega$, $R_2=100\Omega$ and $1/g_m=50\Omega$. In this case, the maximum AC gain (i.e. amount of high frequency gain achievable) according to Equation 5 is (Equation 10):

$$G_{MAX}=1+50/100+50/100=2\sim6\text{ dB}$$

(for completeness, in Equation 10, $G_{MAX}=2$ is unit-less; in logarithmic scale it corresponds to $20*\log_{10}(2)$ which is ~6 dB). Further, the S11 parameter (in decibels) in this case can be calculated according to Equation 9 as (Equation 11);

$$S11=20\times\log(50/(200-50))=-9.5\text{ dB}$$

Reference is now made again to the second example arrangement 300 shown in FIG. 9.

Operation of sampler circuitry 300 will now be described, focusing sometimes on only the first section 301 with the understanding that corresponding considerations apply for the second section 302. Comparing the sampler circuitry 300 to the sampler circuitry 100, it is apparent that (among other differences) the current source 10 (which generates the sampler or bias current $I_{DC}$) is absent from the sampler circuitry 300, whereas it is present in the sampler circuitry 100. Another difference is that in the sampler circuitry 300 the input-connection impedance $330_A$ (which can be considered to correspond with the second impedance $30_A$ of the sampler circuitry 100) is outside of the first current path $300_A$ (in other words, outside the stack, the stack meaning the stack of elements along the first current path $300_A$), whereas in the sampler circuitry 100 the second impedance $30_A$ is connected along a current path from the tail node 12 to the load node $16_A$ (in other words, within the stack, the stack meaning the stack of elements along the current path from $V_{1-1}$ (AVD) via the tail node 12 to the load node $16_A$).

The first and second measurement impedances $350_A$ and $350_B$ are used to sense the common mode voltage indicative of the common mode between voltages at the first and second intermediate nodes $316_A$ and $316_B$. The first and second measurement impedances $350_A$ and $350_B$ are shown in FIG. 9 as resistors by way of example but may be implemented as complex impedances. Preferably, the first and second measurement impedances $350_A$ and $350_B$ are large (relatively speaking) resistors (i.e. resistors having a large resistance value).

The control circuitry 395 receives a measurement signal $S_{CM}$ indicative of the common mode voltage from the measurement node 318. The control circuitry 395 controls the biasing signal $S_B$ which is provided to the biasing node 342 in order to regulate the common mode voltage. That is, the control circuitry 395 controls the biasing signal $S_B$ to bring the measurement signal $S_{CM}$ to or towards a target value corresponding to a target common mode voltage. Thereby, the control circuitry 395 controls or regulates (i.e. brings to or towards a target value) the DC bias current components of the first and second load currents, respectively, because the DC voltage drops over the impedances $320_A$ and $320_B$ are then controlled/regulated. The control circuitry 395 may thus be considered the control element of a common mode control loop.

The load circuitry 340 shown in FIG. 9 comprises switches $340A_0$ to $340A_{N-1}$ and $340B_0$ to $340B_{N-1}$ equivalent to the corresponding switches shown in FIGS. 4 and 5. The switches $340A_0$ to $340B_{N-1}$ are shown in FIG. 9 as switching transistors, and may also be referred to as sampling switches or sampler switches. As described above, the load circuitry 340 may however in general be any current-mode circuitry.

In an example in which the load circuitry 340 comprises the switches $340A_0$ to $340A_{N-1}$ and $340B_0$ to $340B_{N-1}$, the biasing signal $S_B$ may control the DC level of gate-control switching signals provided to gate terminals to the switching transistors $340A_0$ to $340B_{N-1}$. For example, the biasing signal may comprise one or more individual signals for one or more switching transistors $340A_0$ to $340B_{N-1}$.

In the following description of the operation of sampler circuitry 300, it is assumed that the load circuitry 340 is as shown in FIG. 9 and that the biasing signal $S_B$ controls the DC level of gate-control switching signals provided to gate terminals of the switching transistors $340A_0$ to $340B_{N-1}$. In other words, a feedback loop is used to set the DC voltage of the gates of the sampler switches such that a DC component of the current which flows through the first and second supply-connection impedances $320_A$ and $320_6$ is constant or regulated over PVT (process, voltage, temperature). In this case (and considering the first current path $300_A$), the control circuitry 395 controls the biasing signal $S_B$ so that the common mode voltage $V_{CM}$ satisfies the following (Equation 12):

$$AVD = V_{OM} + R_2 \times I_{SAMP}/2$$

where AVD is the voltage reference $V_H$, $R_2$ is the resistance value of the impedance $320_A$, $I_{SAMP}$ is the desired current drawn from AVD by the sampler circuitry 300 (corresponding to $I_{DC}$ in FIG. 4), and the impedances $320_A$ and $320_B$ are the same as one another.

Comparing the sampler circuitry 300 to the sampler circuitry 100, an amount of additional voltage headroom of the sampler circuitry 300 can be determined by calculating the voltage headroom used up by the second impedance $30_A$ and the current source 10 in the sampler circuitry 100 (because the current source 10 is not required in the sampler circuitry 300 and because the second impedance $30_A$ corresponds to the input-connection impedance 330A which is not in the stack).

This additional voltage headroom ΔAVD can be calculated as (Equation 13):

$$\Delta AVD = R_1 \times I_{SAMP}/2 + V_{OD,SAMP}$$

where $V_{OD,SAMP}$ is the overdrive voltage of the current source 10 and $R_1 \times I_{SAMP}/2$ is the voltage drop across the second impedance $30_A$ of the sampler circuitry 100.

Due to this additional voltage headroom of the sampler circuitry 300 compared to the sampler circuitry 100, the supply voltage can be reduced (i.e. the difference between the high and low voltage references reduced). That is, ΔAVD may be considered an amount of supply voltage drop achievable using the sampler circuitry 300 compared to the sampler circuitry 100.

Continuing the example assuming that the load circuitry 340 comprises the sampling switches as shown in FIG. 9, at low frequencies (L for low frequency) the current $I_{2L}$ sampled by the sampler switches (the input-dependent current) from the first current path $300_A$ can be calculated as (Equation 14):

$$I_{2L} = (R_2/(R_2 + 1/g_m)) \times I_{INP}$$

where $I_{INP}$ is the current drawn in at the input node $314_A$, $R_2$ is again the resistance value of the impedance $320_A$, and $g_m$ is the transconductance of the sampler switches. At high frequencies the current $I_{2H}$ (H for high frequency) sampled by the sampler switches (the input-dependent current) from the first current path $300_A$ can be calculated as (Equation 15):

$$I_{2H} = ((R_2 + L_1 \times \omega)/(R_2 + L_1 \times \omega + 1/g_m)) \times I_{INP}$$

where $L_1$ is the inductance value of the supply-connection impedance $320_A$ and $\omega = 2\pi f_{in}$, where fin is the input frequency, i.e. of the input voltage signal $V_{INP}$. Assuming that (Equation 16):

$$R_2 + L_1 \times \omega \gg 1/g_m$$

then Equation 15 can be approximated as follows (Equation 17):

$$I_{2H} \sim I_{INP}$$

Similar to Equation 5 above, the amount of high frequency gain achievable (i.e. the input-dependent current at high frequency compared to the input-dependent current at low frequency) of sampler circuitry 300 can be calculated/approximated by dividing Equation 17 by Equation 14. Therefore the amount of high frequency gain achievable $G_{MAX}$ is (Equation 18):

$$G_{MAX} = 1 + 1/g_m R_2$$

Similar to Equations 6 to 9 above, the reflection coefficient (S11 parameter) can be calculated as follows. At low frequencies, the impedance $Z_{INL}$ seen looking into the input node 314A from the input terminal 315A can be calculated/approximated as (Equation 19):

$$Z_{INL}=R_1+1/g_m\|R_2=Z_0$$

where $R_1$ is the resistance value of the input-connection impedance 330A. At high frequencies, the impedance $Z_{INH}$ (H for high frequency) seen looking into the input node $314_A$ from the input terminal $315_A$ can be calculated/approximated as (Equation 20):

$$Z_{INH}=R_1+1/g_m\|(R_2+L_1\times\omega)\sim(R_1+1/g_m)$$

Using Equation 19 in Equation 20, the high frequency impedance $Z_{INH}$ can be calculated/approximated as (Equation 21):

$$Z_{INH}=Z_0+(1/g_m)/(1+g_m\times R_2)$$

Therefore the reflection coefficient (S11 parameter) can be calculated as (Equation 22):

$$S11=1/(1+2g_m\times Z_0\times(1+g_m\times R_2))$$

A comparison can now be made between the sampler circuitry 100 and the sampler circuitry 300.

Both sampler circuitry 100 and sampler circuitry 300 provide similar high frequency gain. As an example, $R_1$=25Ω, $R_2$=50Ω and $1/g_m$=50Ω. In this case, the maximum AC gain (i.e. amount of high frequency gain achievable) according to Equation 18 is (Equation 23):

$$G_{MAX}=1+50/50=2\sim 6 \text{ dB}$$

This is similar to the gain $G_{MAX}$ calculated for the sampler circuitry 100.

The S11 parameter (in dB) for the sampler circuitry 300 can be calculated using Equation 22 as (Equation 24):

$$S11=1/(1+(2/50)\times 50\times(1+50/50))=1/5\sim -14 \text{ dB}$$

Comparing the gain and the S11 parameter for the above examples (i.e. Equations 10, 11, 23 and 24), it is apparent that the sampler circuitry 300 can provide a similar gain compared to the sampler circuitry 100 whilst providing improved S11 performance (S11 scattering parameter value).

Due to the additional voltage headroom of the sampler circuitry 300 compared to the sampler circuitry 100, the supply voltage can be lowered (i.e. the difference between the high and low voltage references $V_H$ and $V_L$ can be reduced) which is advantageous from a power-saving point of view. Another advantage is that the additional voltage headroom can be used in the load circuitry and/or subsequent circuitry.

Figure 10:
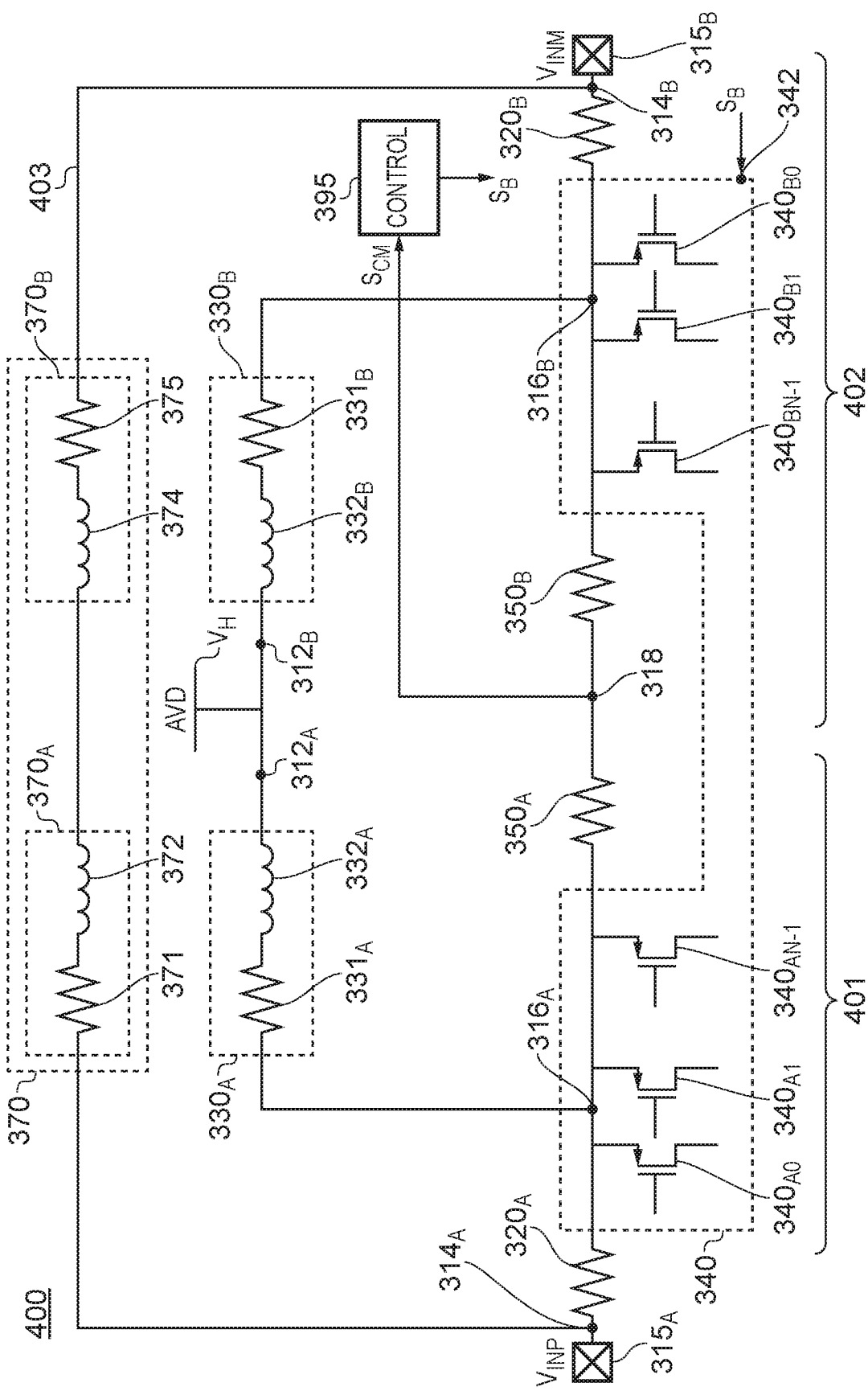
FIG. 10 is a schematic diagram of a modified second example arrangement of sampler circuitry.

FIG. 10 is a schematic diagram of a modified second example arrangement 400 of sampler circuitry.

Sampler circuitry 400 comprises first and second matching (or corresponding or complementary) sections 401 and 402 for the two differential inputs, the first and second sections 401 and 402 corresponding closely with the first and second sections 301 and 302 of sampler circuitry 300. Each element of the sampler circuitry 400 in common with sampler circuitry 300 has the same reference numeral as the corresponding element of the sampler circuitry 300. The principle of operation of the sampler circuitry 400 is substantially the same as that of the sampler circuitry 300 and duplicate description of elements common to sampler circuitry 300 and sampler circuitry 400 is omitted.

The sampler circuitry 400 additionally comprises an auxiliary current path 403 connected between the first and second input nodes $314_A$ and $314_6$, and having an auxiliary impedance 370 connected therealong. The auxiliary impedance 370 as shown in FIG. 10 comprises two resistors 371 and 375 and two inductors 372 and 374. In brief, the auxiliary current path 403 provides an additional AC signal path for the input current and consequently, another gain factor (i.e. gain boosting at high frequencies, relative to at low frequencies) at frequencies when the inductors 372 and 374 begin to dominate. The auxiliary impedance 370 can of course have other arrangements comprising any element(s) giving rise to an impedance, for example a single resistor and a single inductor.

Similar calculations as for the sampler circuitry 300 can be applied to the sampler circuitry 400 as follows, focusing on the first section 401 with the understanding that equivalent analysis can be carried out for the second section 402. At low frequencies (of the input voltage signal $V_{INP}$) the current $I_{2L}$ sampled by the sampler switches (the input-dependent current) from the first current path $300_A$, and including a contribution from the auxiliary current path 403, can be calculated as (Equation 25):

$$I_{2L}=(R_3/(R_3+R_1+R_2\|(1/g_m)))\times(R_2/(R_2+1/g_m))\times I_{INP}$$

where $R_3$ is the resistance value of the auxiliary impedance 370A and the other quantities are as described with reference to the sampler circuitry 300. At high frequency, the inductance values of the supply-connection impedance $330_A$ and of the auxiliary impedance $370_A$ become large and (substantially) all the input current $I_{INP}$ goes into the sampler switches. Therefore at high frequency the current $I_{2H}$ sampled by the sampler switches (the input-dependent current) from the first current path 300A, and including a contribution from the auxiliary current path 403, can be calculated as (Equation 26):

$$I_{2H}\sim I_{INP}$$

The amount of high frequency gain achievable or AC gain (i.e. the input-dependent current at high frequency compared to the input-dependent current at low frequency) is Equation 26 divided by Equation 25. Therefore the amount of high frequency gain achievable $G_{MAX}$ is (Equation 27):

$$G_{MAX}=(1+R_1/R_3+(R_2\|1/g_m)/R_3)\times(1+1/g_mR_2)$$

Comparing the amount of high frequency gain achievable (or AC gain) for the sampler circuitry 400 to that for the sampler circuitry 300 (i.e. comparing equations 18 and 27), it is apparent that the amount of extra gain achieved due to the auxiliary current path 403 is (Equation 28):

$$G_{boost}=1+R_1/R_3+(R_2\|1/g_m)/R_3$$

As an example for the sampler circuitry 400, $R_1$=50Ω, $R_2$=50Ω, $R_3$=150Ω and $1/g_m$=50Ω. According to Equation 28, the extra gain of the sampler circuitry 400 compared to the sampler circuitry 300 is (Equation 29):

$$G_{boost}=(1+50/150+(50\|50)/150)=1.5\sim 3.5 \text{ dB}$$

Referring to Equation 23, this means that the total amount of high frequency gain achievable (i.e. the input-dependent current at high frequency compared to the input-dependent current at low frequency) for the sampler circuitry 400 is approximately (Equation 30):

$$G_{MAX}=6 \text{ dB}+3.5 \text{ dB}=9.5 \text{ dB}$$

Therefore, the sampler circuitry 400 provides a very large gain with which, when the load circuitry 340 is for example a front-end of a (sub-) ADC, near Nyquist rate bandwidth ADC operation can be achieved.

Continuing the analysis of the sampler circuitry 400, at high frequency the inductance values of the inductors $332_A$ and 372 (and 374) become very large so that the impedance $Z_{INH}$ seen looking into the input node $314_A$ from the input terminal $315_A$ can be calculated/approximated as (Equation 31):

$$Z_{INH} \sim (R_1 + 1/g_m)$$

It is apparent that this high frequency impedance is similar to the high frequency impedance for the sampler circuitry 100 calculated in Equation 7. Using the example parameter values above, the S11 parameter (reflection coefficient) can be calculated (using Equation 9) as (Equation 32):

$$S11 = (100-50)/(100+50) = 1/3 \sim -9.5 \text{ dB}$$

This value for the S11 parameter is similar to the S11 parameter for the sampler circuitry 100 (Equation 11). Therefore the sampler circuitry 400 can operate with much higher AC gain (i.e. the amount of high frequency gain achievable $G_{MAX}$, Equation 30) than the sampler circuitry 100 but with similar S11 performance (i.e. Equation 32), whilst there is the additional advantage that the supply voltage (i.e. the difference between the high and low voltage references) can be dropped compared to the sampler circuitry 100 for example by the amount calculated in (13).

To demonstrate the advantages associated with the second example arrangement 300 and the modified second example arrangement 400, circuitry has been designed (in particular a 77 GSa/s sampler) and simulated using the sampler circuitry 100, the second example arrangement 300 and the modified second example arrangement 400.

Figure 11A:
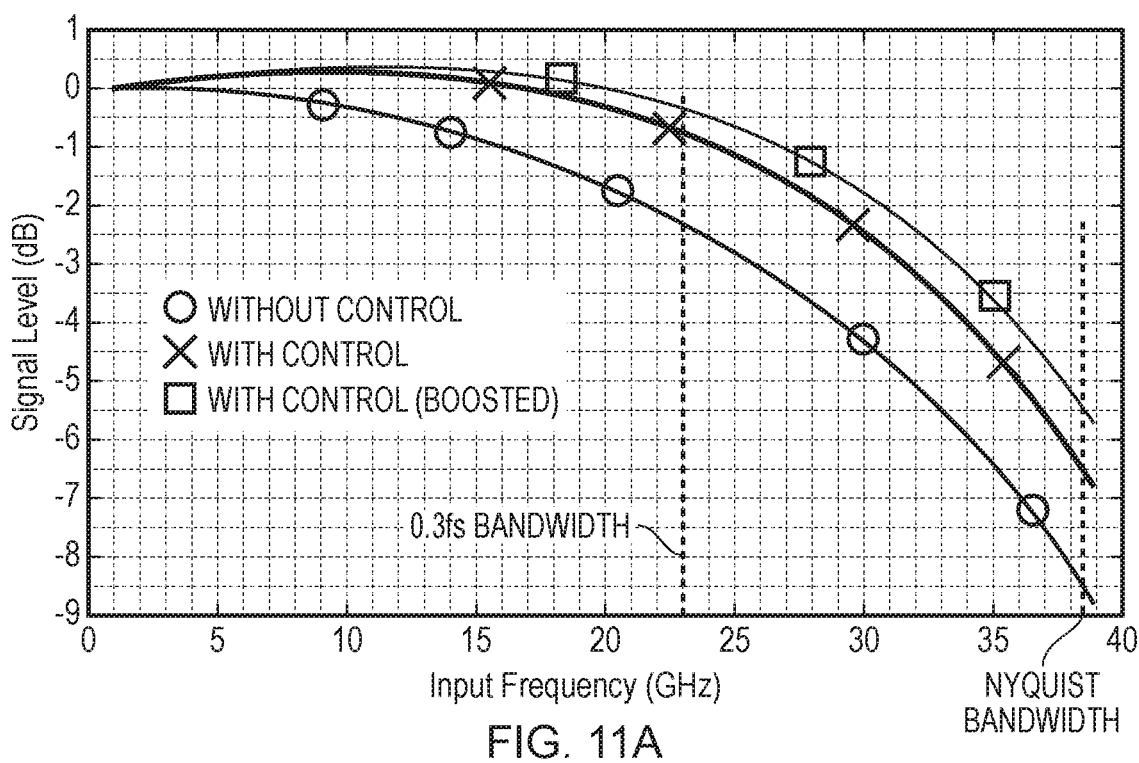
FIGS. 11A and 11B are graphs useful for understanding the sampler circuitry of FIGS. 9 and 10.

FIG. 11A is a graph showing the signal level of the reconstructed signal at the output of the designed and simulated 77 GSa/s sampler with respect to the input signal ($V_{INP/M}$) frequency for the sampler circuitry 100 (without control), the second example arrangement 300 (with control) and the modified second example arrangement 400 (with control (boosted)). Also marked on the graph in FIG. 11A is the frequency at 0.3 fs bandwidth, which is a useful example frequency to consider (for example, in current-mode ADCs such as disclosed in EP2211468, a "sine effect" due to the integration of charge/current can theoretically limit the bandwidth of the system to a value more than 0.3 fs but less than the Nyquist bandwidth), and the Nyquist bandwidth.

It is apparent from FIG. 11A that the second example arrangement 300 provides improved bandwidth compared to the sampler circuitry 100 and that the modified second example arrangement 400 provides improved bandwidth compared to the sampler circuitry 100 and to the second example arrangement 300. In the simulation on which the graph in FIG. 11A is based, the sampler circuitry 100 was implemented with a 1.8 V supply voltage (i.e. difference between high and low reference voltages) while the second example arrangement 300 and the modified second example arrangement 400 were implemented with a 1.5 V supply voltage, demonstrating the advantage of supply voltage reduction. The second example arrangement 300 and the modified second example arrangement 400 can work with supply voltages less than 1.5 V.

Figure 11B:
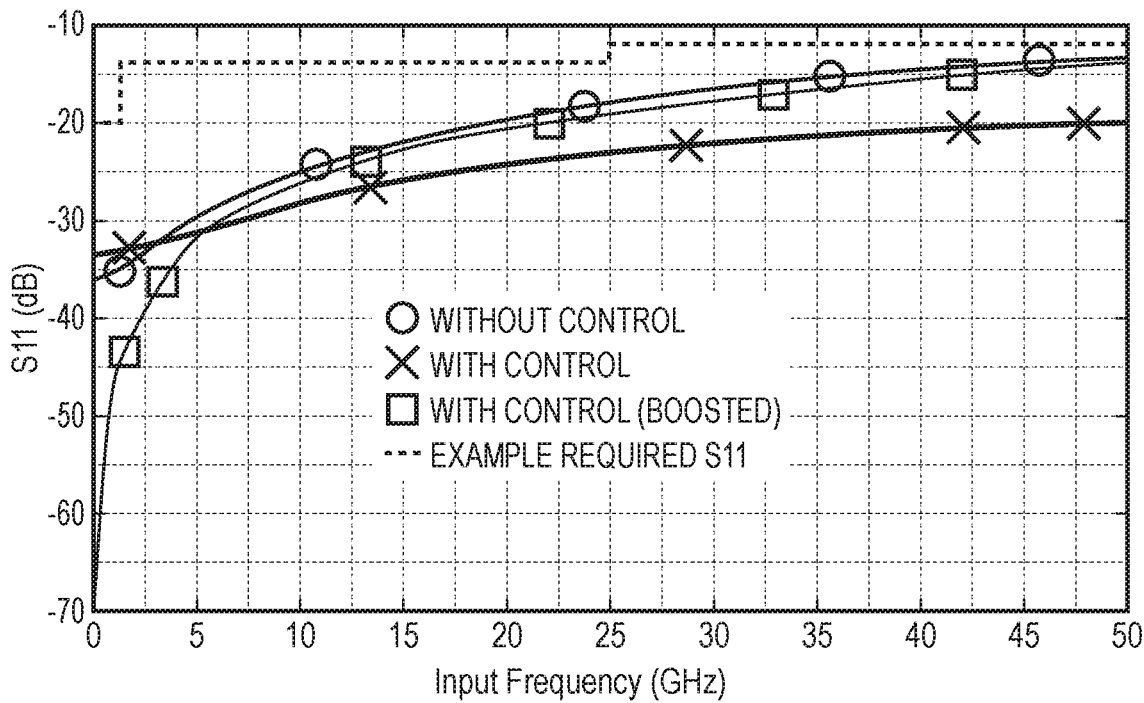

FIG. 11B is a graph showing the S11 parameter value profile of the designed and simulated 77 GSa/s sampler for the sampler circuitry 100 (without control), the second example arrangement 300 (with control) and the modified second example arrangement 400 (with control (boosted)).

Also marked on the graph in FIG. 11B with a dotted line is an example S11 specification. In the simulation on which the graph in FIG. 11B is based, the sampler circuitry 100 was implemented with a 1.8 V supply voltage (i.e. difference between high and low reference voltages) while the second example arrangement 300 and the modified second example arrangement 400 were implemented with a 1.5 V supply voltage, demonstrating the advantage of supply voltage reduction. The second example arrangement 300 and the modified second example arrangement 400 can work with supply voltages less than 1.5 V.

It is apparent from FIG. 11B that the second example arrangement 300 provides the best S11 performance while the modified second example arrangement 400 provides similar S11 performance to the sampler circuitry 100 as predicted in Equation 32, but the modified second example arrangement 400 provides more gain compared to the sampler circuitry 100 and to the second example arrangement 300.

In summary, some of the advantages of the second example arrangement 300 and the modified second example arrangement 400 (both of which may be referred to as a low voltage, gain boosted current mode sampler) compared to, for example, the sampler circuitry 100 are as follows.

Removal of current source (i.e. current source 10 in sampler circuitry 100) from the stack. The current source (as a separate element) is not required in either of the first and second current paths $300_A$ and $300_B$. This results in additional voltage headroom. The removal of the current source from the stack is advantageous from a power-saving point of view.

Removal of matching network from stack. That is, the input-connection impedances $330_A$ and $330_B$ are outside the first and second current paths $300_A$ and $300_B$, respectively. This results in improved S11 performance, relaxed requirements concerning ensuring good S11 performance, and improved voltage headroom.

Reduction in supply voltage. Due to the additional voltage headroom, the supply voltage can be reduced. This is advantageous from a power-saving point of view.

Improved S11 (input matching) performance. The S11 performance of the sampler circuitry 300 and 400 is better than (or at least as good as) the S11 performance of the sampler circuitry 100, whilst at the same time a better gain "profile" and improved voltage headroom can be provided by the sampler circuitry 300 and 400.

Addition of gain (high frequency compared to low frequency) into the signal path without affecting the S11 parameter, in the sense of (relative) boosting at high frequencies (i.e. sacrificing gain at low frequencies so that it appears better at high frequencies—i.e. to affect the gain profile but without adding overall DC to high frequency gain, such as active-device gain). As described above, sampler circuitry 300 provides improved gain (high frequency gain boosting) compared to the sampler circuitry 100 and the sampler circuitry 400 provides improved gain (high frequency gain boosting) compared to the sampler circuitry 100 and 300. At the same time, the sampler circuitry 300 and 400 can provide improved (or at least as good) S11 performance and also improved voltage headroom.

Bandwidth extension. The bandwidth can be extended due to the improved gain "profile" and due to the improved S11 parameter.

Sampler circuitry 100, 200, 300 and 400 are shown in the Figures as comprising P-channel devices (in this case, field-effect transistors). N-channel devices may also be used in place of P-channel devices, i.e. by providing the circuitry the "other way up".

Figure 12A:
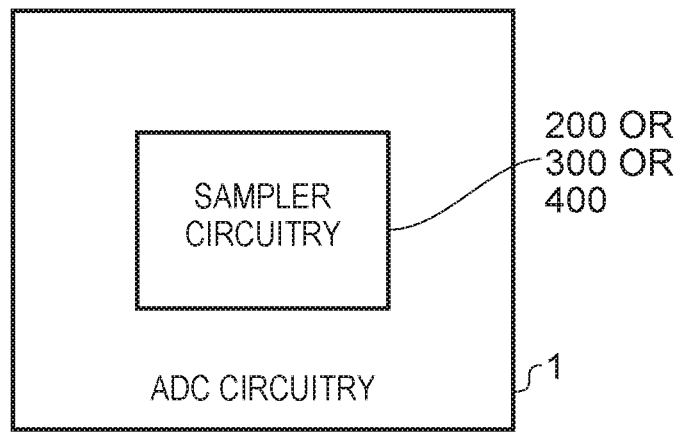
FIG. 12A is a schematic diagram of ADC circuitry.

It will be appreciated that sampler circuitry 200, 300, 400 could be provided along with mixed-signal circuitry such as ADC circuitry (or, in some arrangements, DAC circuitry). As illustrated in FIG. 12A, for example, sampler circuitry 200, 300, 400 disclosed herein could be provided along with or as part of ADC circuitry 1.

Figure 12B:
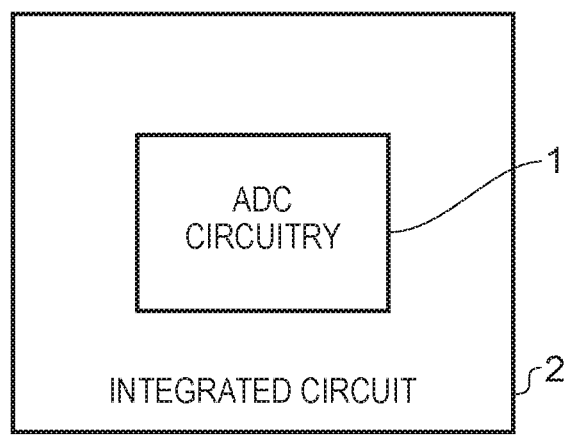
FIG. 12B is a schematic diagram of an integrated circuit.

Circuitry of the present invention may be implemented as integrated circuitry, for example on an IC chip such as a flip chip. FIG. 12B is a schematic diagram of an integrated circuit 2 comprising the ADC circuitry 1. An integrated circuit comprising the sampler circuitry 200, 300 and/or 400 could also be provided.

The present invention extends to integrated circuitry and IC chips as mentioned above, circuit boards comprising such IC chips, and communication networks (for example, internet fiber-optic networks and wireless networks) and network equipment of such networks, comprising such circuit boards. Circuitry of the present invention may also be implemented with discrete components provided on circuit boards. Circuitry of the present invention may be implemented alone (as a standalone circuit) or together with other circuitry.

In any of the above method aspects (for example, control of values stored in the register 295 or control of the control unit 395), the various features as appropriate may be implemented in hardware, or as software modules running on one or more processors. Features of one aspect may be applied to any of the other aspects.

The invention also provides a computer program or a computer program product for carrying out any of the methods described herein, and a computer readable medium having stored thereon a program for carrying out any of the methods described herein. A computer program embodying the invention may be stored on a computer-readable medium, or it could, for example, be in the form of a signal such as a downloadable data signal provided from an Internet website, or it could be in any other form.

Further embodiments may be provided within the spirit and scope of the present invention as disclosed herein.

The invention claimed is:

1. Sampler circuitry, comprising:
an input node configured to receive an input voltage signal;
a primary current path connected between high and low voltage supply nodes;
a secondary current path connected between high and low voltage supply nodes;
current mirror circuitry; and
load circuitry comprising sampler switches operable to sample a current signal,
wherein:
the input node is defined along the primary current path, the primary current path configured to carry a primary current dependent on the input voltage signal;
the current mirror circuitry comprises a primary side and a secondary side, the primary side connected along the primary current path and the secondary side connected along the secondary current path so that a secondary current dependent on the primary current is caused to flow along the secondary current path; and
the load circuitry is connected along the secondary current path so that the secondary current at least partly forms the current signal.

2. The sampler circuitry as claimed in claim 1, further comprising a current source connected along the primary current path and configured to define a bias current flowing along that path.

3. The sampler circuitry as claimed in claim 1, wherein:
the input node is located along the primary current path so as to divide the primary current path into first and second portions, the first portion of the primary current path configured to carry the primary current; and
the primary side of the current mirror circuitry is connected along the first portion of the primary current path.

4. The sampler circuitry as claimed in claim 3, further comprising an impedance connected in series along the first portion of the primary current path between the input node and the primary side of the current mirror circuitry.

5. The sampler circuitry as claimed in claim 4, wherein the impedance is a second impedance, and wherein the sampler circuitry further comprises a first impedance connected in series along the second portion of the primary current path.

6. The sampler circuitry as claimed in claim 5, wherein:
the first impedance is implemented as a resistor or as a resistor connected in series with an inductor; and/or
the second impedance is implemented as a resistor or as a resistor connected in parallel with a capacitor.

7. The sampler circuitry as claimed in claim 1, further comprising:
a third impedance connected in series along the primary current path between the high voltage supply node concerned and the primary side of the current mirror circuitry; and/or
a fourth impedance connected in series along the secondary current path between the high voltage supply node concerned and the secondary side of the current mirror circuitry.

8. The sampler circuitry as claimed in claim 7, wherein:
the third impedance is implemented as a resistor or as a resistor connected in series with an inductor; and/or
the fourth impedance is implemented as a resistor or as a resistor connected in parallel with a capacitor.

9. The sampler circuitry as claimed in claim 1, further comprising a fifth impedance connected between the primary and secondary sides of the current mirror circuitry,
optionally between gate terminals of a diode-connected transistor of the primary side and a corresponding mirror transistor of the secondary side of the current mirror circuitry,
optionally wherein the fifth impedance is implemented as an inductor.

10. The sampler circuitry as claimed in claim 1, further comprising control circuitry operable to configure the current mirror circuitry so as to control a gain provided by the current mirror circuitry in the secondary current relative to the primary current.

11. The sampler circuitry as claimed in claim 10, wherein the control circuitry is configured to control one or more voltage signals applied to the gates of one or more transistors of the current mirror circuitry, optionally to switch the or those transistors on or off, to control the gain provided by the current mirror circuitry.

12. The sampler circuitry as claimed in claim 11, wherein the primary and secondary sides of the current mirror circuitry each comprise at least one cascode transistor, and wherein the voltage signals controlled by the control circuitry are voltage signals provided to the gates of cascode transistors of the current mirror circuitry, optionally to the gates of one or more cascode transistors of the secondary side of the current mirror circuitry, optionally wherein the control circuitry is configured to control one or more gate voltages of one or more cascode transistors, respectively, of the primary side of the current mirror circuitry so that the one or more cascode transistors of the primary side of the current mirror circuitry operate at or around the border of their triode and saturation regions.

13. Differential sampler circuitry comprising a first section and a second section, the first and second sections each comprising sampler circuitry as claimed in claim 1.

14. Analogue-to-digital conversion circuitry comprising the sampler circuitry of claim 1.

15. Integrated circuitry, such as an IC chip, comprising the sampler circuitry of claim 1.

* * * * *